United States Patent
Huang

(10) Patent No.: US 11,469,195 B2
(45) Date of Patent: Oct. 11, 2022

(54) SEMICONDUCTOR DEVICE WITH TILTED INSULATING LAYERS AND METHOD FOR FABRICATING THE SAME

(71) Applicant: NANYA TECHNOLOGY CORPORATION, New Taipei (TW)

(72) Inventor: Tse-Yao Huang, Taipei (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 132 days.

(21) Appl. No.: 17/031,119

(22) Filed: Sep. 24, 2020

(65) Prior Publication Data

US 2022/0093490 A1 Mar. 24, 2022

(51) Int. Cl.
| | |
|---|---|
| *H01L 23/00* | (2006.01) |
| *H01L 23/485* | (2006.01) |
| *H01L 21/311* | (2006.01) |
| *H01L 21/02* | (2006.01) |
| *H01L 21/033* | (2006.01) |

(52) U.S. Cl.
CPC ........ *H01L 24/05* (2013.01); *H01L 21/02203* (2013.01); *H01L 21/0337* (2013.01); *H01L 21/31116* (2013.01); *H01L 21/31144* (2013.01); *H01L 23/485* (2013.01); *H01L 24/03* (2013.01); *H01L 21/02348* (2013.01); *H01L 2224/0557* (2013.01); *H01L 2224/05076* (2013.01); *H01L 2224/05078* (2013.01); *H01L 2224/05082* (2013.01); *H01L 2224/05095* (2013.01); *H01L 2924/30105* (2013.01)

(58) Field of Classification Search
None
See application file for complete search history.

(56) References Cited

U.S. PATENT DOCUMENTS

2015/0041990 A1* 2/2015 Sekine .............. H01L 21/76898
257/774

* cited by examiner

*Primary Examiner* — Scott B Geyer
(74) *Attorney, Agent, or Firm* — Muncy, Geissler, Olds & Lowe, P.C.

(57) ABSTRACT

The present disclosure relates to a semiconductor device with tilted insulating layers and a method for fabricating the semiconductor device with the tilted insulating layers. The semiconductor device includes a substrate, two conductive pillars positioned above the substrate and extended along a vertical axis, a first set of tilted insulating layers parallel to each other and positioned between the two conductive pillars, and a second set of tilted insulating layers parallel to each other and positioned between the two conductive pillars. The first set of tilted insulating layers are extended along a first direction slanted with respect to the vertical axis, the second set of tilted insulating layers are extended along a second direction slanted with respect to the vertical axis, and the first direction and the second direction are crossed.

20 Claims, 22 Drawing Sheets

SEMICONDUCTOR DEVICE WITH TILTED INSULATING LAYERS AND METHOD FOR FABRICATING THE SAME

TECHNICAL FIELD

The present disclosure relates to a semiconductor device and a method for fabricating the semiconductor device, and more particularly, to a semiconductor device with tilted insulating layers and a method for fabricating the semiconductor device with the tilted insulating layers.

DISCUSSION OF THE BACKGROUND

Semiconductor devices are used in a variety of electronic applications, such as personal computers, cellular telephones, digital cameras, and other electronic equipment. The dimensions of semiconductor devices are continuously being scaled down to meet the increasing demand of computing ability. However, a variety of issues arise during the scaling-down process, and such issues are continuously increasing. Therefore, challenges remain in achieving improved quality, yield, performance, and reliability and reduced complexity.

This Discussion of the Background section is provided for background information only. The statements in this Discussion of the Background are not an admission that the subject matter disclosed in this section constitutes prior art to the present disclosure, and no part of this Discussion of the Background section may be used as an admission that any part of this application, including this Discussion of the Background section, constitutes prior art to the present disclosure.

SUMMARY

One aspect of the present disclosure provides a semiconductor device including a substrate, two conductive pillars positioned above the substrate and extended along a vertical axis, a first set of tilted insulating layers parallel to each other and positioned between the two conductive pillars, and a second set of tilted insulating layers parallel to each other and positioned between the two conductive pillars. The first set of tilted insulating layers are extended along a first direction slanted with respect to the vertical axis, the second set of tilted insulating layers are extended along a second direction slanted with respect to the vertical axis, and the first direction and the second direction are crossed.

In some embodiments, the semiconductor device includes a first insulating layer positioned above the substrate. The two conductive pillars are positioned along the first insulating layer, the first set of tilted insulating layers and the second set of tilted insulating layers are positioned in the first insulating layer, and the first set of tilted insulating layers and the second set of tilted insulating layers are formed of a different material from the first insulating layer.

In some embodiments, the first set of tilted insulating layers and the second set of tilted insulating layers are formed of a material having a lower dielectric constant than that of the first insulating layer.

In some embodiments, the first set of tilted insulating layers and the second set of tilted insulating layers are porous.

In some embodiments, porosities of the first set of tilted insulating layers and the second set of tilted insulating layers are between about 10% and about 80%.

In some embodiments, the first set of tilted insulating layers and the second set of tilted insulating layers are formed of a material having a coefficient of thermal expansion less than about 20 ppm/° C. and a Young's Modulus less than about 15 GPa.

In some embodiments, the semiconductor device includes a pad layer positioned on the two conductive pillars, the first set of tilted insulating layers, and the second set of tilted insulating layers.

In some embodiments, an angle between the first direction and the vertical axis is between about 10 degree and about 80 degree.

In some embodiments, an angle between the second direction and the vertical axis is between about −10 degree and about −80 degree.

In some embodiments, an angle between the first direction and the vertical axis is different from an angle between the second direction and the vertical axis.

In some embodiments, an angle between the first direction and the vertical axis is opposite to an angle between the second direction and the vertical axis.

In some embodiments, bottom surfaces of the first set of tilted insulating layers and bottom surfaces of the second set of tilted insulating layers are substantially coplanar with a bottom surface of the first insulating layer.

In some embodiments, bottommost points of the first set of tilted insulating layers and bottommost points of the second set of tilted insulating layers are at a vertical level above a bottom surface of the first insulating layer.

Another aspect of the present disclosure provides a method for fabricating a semiconductor device including providing a substrate, forming a first insulating layer above the substrate, forming two conductive pillars along the first insulating layer, forming a first set of tilted trenches along the first insulating layer and between the two conductive pillars, forming a second set of tilted trenches along the first insulating layer and between the two conductive pillars, forming a first set of tilted insulating layers in the first set of tilted trenches and along a first direction, forming a second set of tilted insulating layers in the second set of tilted trenches and along a second direction. The first set of tilted insulating layers and the second set of tilted insulating layers are concurrently formed, and the first direction and second direction are crossed.

In some embodiments, the first set of tilted insulating layers and the second set of tilted insulating layers are formed of a different material from the first insulating layer.

In some embodiments, the first set of tilted insulating layers and the second set of tilted insulating layers are formed of a material having a lower dielectric constant than that of the first insulating layer.

In some embodiments, the step of forming the first set of tilted trenches includes forming a first hard mask layer on the first insulating layer, forming first hard mask openings along the first hard mask layer, using the first hardmask layer and the first hard mask openings as pattern guides to perform a first tilted etch process on the first insulating layer to form the first set of tilted trenches.

In some embodiments, the first hard mask layer is formed of silicon oxide, silicon nitride, silicon oxynitride, silicon nitride oxide, boron nitride, silicon boron nitride, phosphorus boron nitride, boron carbon silicon nitride, or a carbon film.

In some embodiments, the step of forming a second set of tilted insulating layers includes using the first hard mask layer and the first hard mask openings as pattern guides to perform a second tilted etch process on the first insulating layer to form the second set of tilted trenches and an angle of incidence of the first tilted etch process is opposite to the angle of incidence of the second tilted etch process.

In some embodiments, the step of forming the first set of tilted insulating layers and the step of forming the second set of tilted insulating layers includes forming a layer of energy-removable composite in the first set of tilted trenches and the second set of tilted trenches and the layer of energy-removable composite includes a base material and a decomposable porogen material, performing an energy treatment to turn the layer of energy-removable composite into the first set of tilted insulating layers and the second set of tilted insulating layers.

Due to the design of the semiconductor device of the present disclosure, the first set of tilted insulating layers and the second set of tilted insulating layers may be used to adjust the dielectric constant between the conductive pillars. Therefore, the parasitic capacitance between the conductive pillars may be reduced. As a result, the performance of the semiconductor device may be improved. In addition, the first set of tilted insulating layers and the second set of tilted insulating layers may increase the elastic property of the first insulating layer which may improve the resistance of the bonding strength of the semiconductor device during a bonding process or a wiring process.

The foregoing has outlined rather broadly the features and technical advantages of the present disclosure in order that the detailed description of the disclosure that follows may be better understood. Additional features and advantages of the disclosure will be described hereinafter, and form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1:
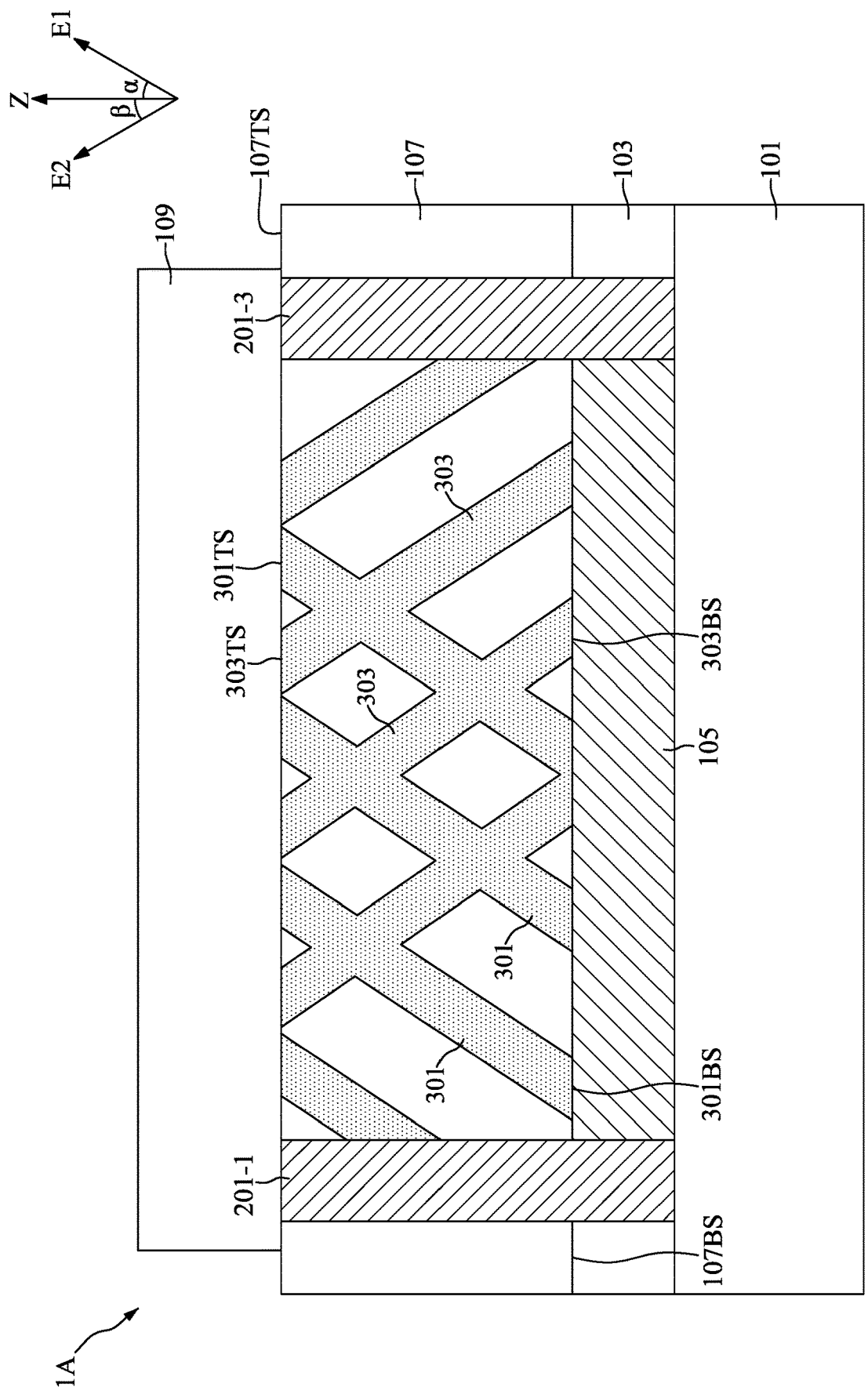
FIG. 1 illustrates, in a schematic cross-sectional view diagram, a semiconductor device in accordance with one embodiment of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

It should be understood that when an element or layer is referred to as being "connected to" or "coupled to" another element or layer, it can be directly connected to or coupled to another element or layer, or intervening elements or layers may be present.

It should be understood that, although the terms first, second, etc. may be used herein to describe various elements, these elements should not be limited by these terms. Unless indicated otherwise, these terms are only used to distinguish one element from another element. Thus, for example, a first element, a first component or a first section discussed below could be termed a second element, a second component or a second section without departing from the teachings of the present disclosure.

Unless the context indicates otherwise, terms such as "same," "equal," "planar," or "coplanar," as used herein when referring to orientation, layout, location, shapes, sizes, amounts, or other measures do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes. The term "substantially" may be used herein to reflect this meaning. For example, items described as "substantially the same," "substantially equal," or "substantially planar," may be exactly the same, equal, or planar, or may be the same, equal, or planar within acceptable variations that may occur, for example, due to manufacturing processes.

In the present disclosure, a semiconductor device generally means a device which can function by utilizing semiconductor characteristics, and an electro-optic device, a light-emitting display device, a semiconductor circuit, and an electronic device are all included in the category of the semiconductor device.

It should be noted that, in the description of the present disclosure, above (or up) corresponds to the direction of the arrow of the vertical axis Z, and below (or down) corresponds to the opposite direction of the arrow of the vertical axis Z.

FIG. 1 illustrates, in a schematic cross-sectional view diagram, a semiconductor device 1A in accordance with one embodiment of the present disclosure.

With reference to FIG. 1, in some embodiments, the substrate 101 may include a bulk semiconductor substrate formed of, for example, an elementary semiconductor, such as silicon or germanium; a compound semiconductor, such as silicon germanium, silicon carbide, gallium arsenide, gallium phosphide, indium phosphide, indium arsenide, indium antimonide, or other III-V compound semiconductor or II-VI compound semiconductor.

In some embodiments, the substrate 101 may include a semiconductor-on-insulator structure which consisting of, from bottom to top, a handle substrate, an insulator layer, and a topmost semiconductor layer. The handle substrate and the topmost semiconductor layer may be formed of materials similar to the aforementioned bulk semiconductor substrate. The insulator layer may be a crystalline or non-crystalline dielectric material such as an oxide and/or nitride. The insulator layer may have a thickness between about 10 nm and 200 nm.

The substrate 101 may also include dielectrics, insulating layers, or conductive features formed on the bulk semiconductor substrate or the semiconductor-on-insulator structure. The dielectrics or the insulating layers may include, for example, a semiconductor oxide, a semiconductor nitride, semiconductor oxynitride, semiconductor carbide, tetraethyl orthosilicate oxide, phosphosilicate glass, borophosphosilicate glass, fluorinated silica glass, carbon doped silicon oxide, amorphous fluorinated carbon, or combinations thereof. The conductive features may be conductive lines, conductive vias, conductive contacts, or the like. The dielectrics or the insulating layers may act as an insulator that supports and electrically isolates the conductive features.

In some embodiments, device elements (not shown) may be formed in the substrate 101. The device elements may be, for example, bipolar junction transistors, metal-oxide-semiconductor field effect transistors, diodes, system large-scale integration, flash memories, dynamic random-access memories, static random-access memories, electrically erasable programmable read-only memories, image sensors, micro-electro-mechanical system, active devices, or passive devices. The device elements may be electrically insulated from neighboring device elements by insulating structures such as shallow trench isolation.

With reference to FIG. 1, the bottom insulating layer 103 may be disposed on the substrate 101. In some embodiments, the bottom insulating layer 103 may be formed of, for example, silicon nitride, silicon oxide, silicon oxynitride, silicon nitride oxide, flowable oxide, tonen silazen, undoped silica glass, borosilica glass, phosphosilica glass, borophosphosilica glass, plasma-enhanced tetra-ethyl orthosilicate, fluoride silicate glass, carbon-doped silicon oxide, organo silicate glass, low-k dielectric material, or a combination thereof. The low-k dielectric material may have a dielectric constant less than 3.0 or even less than 2.5.

With reference to FIG. 1, the bottom conductive layer 105 may be disposed in the bottom insulating layer 103. The bottom conductive layer 105 may be formed of, for example, copper, aluminum, titanium, tungsten, the like, or a combination thereof. The bottom conductive layer 105 may be electrically coupled to the device elements.

With reference to FIG. 1, the first insulating layer 107 may be disposed on the bottom insulating layer 103. In some embodiments, the first insulating layer 107 may be formed of, for example, silicon nitride, silicon oxide, silicon oxynitride, silicon nitride oxide, flowable oxide, tonen silazen, undoped silica glass, borosilica glass, phosphosilica glass, borophosphosilica glass, plasma-enhanced tetra-ethyl orthosilicate, fluoride silicate glass, carbon-doped silicon oxide, organo silicate glass, low-k dielectric material, or a combination thereof.

In some embodiments, the first insulating layer 107 may be formed of, for example, silicon oxide, silicon nitride, silicon oxynitride, silicon oxide nitride, polyimide, polybenzoxazole, phosphosilicate glass, undoped silica glass, or fluoride silicate glass. The first insulating layer 107 may be referred to as a passivation layer.

With reference to FIG. 1, the conductive pillars 201-1, 201-3 may be vertically disposed along the first insulating layer 107 and the bottom insulating layer 103. That is, the conductive pillars 201-1, 201-3 may be extended along the vertical axis Z. The bottom portions of the sidewalls of the conductive pillars 201-1, 201-3 may be attached to the bottom conductive layer 105. In other words, the conductive pillars 201-1, 201-3 and the bottom conductive layer 105 may be electrically connected. The top surfaces of the conductive pillars 201-1, 201-3 may be substantially coplanar with the top surface 107TS of the first insulating layer 107. The conductive pillars 201-1, 201-3 may be formed of, for example, tungsten, cobalt, zirconium, tantalum, titanium, aluminum, ruthenium, copper, metal carbides (e.g., tantalum carbide, titanium carbide, tantalum magnesium carbide), metal nitrides (e.g., titanium nitride), transition metal aluminides, or combinations thereof.

With reference to FIG. 1, the first set of tilted insulating layers 301 may be disposed in the first insulating layer 107 and between the conductive pillars 201-1, 201-3. The top surfaces 301TS of the first set of tilted insulating layers 301 may be substantially coplanar with the top surface 107TS of the first insulating layer 107. The bottom surface 301BS of the first set of tilted insulating layers 301 may be substantially coplanar with the bottom surface 107BS of the first insulating layer 107. The first set of tilted insulating layers 301 may be parallel to each other. The first set of tilted insulating layers 301 may extend along a first direction E1. The first direction E1 may be slanted with respect to the vertical axis Z. An angle $\alpha$ between the first direction E1 and the vertical axis Z may be between about 10 degree and about 80 degree.

With reference to FIG. 1, the second set of tilted insulating layers 303 may be disposed in the first insulating layer 107 and between the conductive pillars 201-1, 201-3. The top surfaces 303TS of the second set of tilted insulating layers 303 may be substantially coplanar with the top surface 107TS of the first insulating layer 107. The bottom surface 303BS of the second set of tilted insulating layers 303 may be substantially coplanar with the bottom surface 107BS of the first insulating layer 107. The second set of tilted insulating layers 303 may be parallel to each other. The second set of tilted insulating layers 303 may extend along a second direction E2. The second direction E2 may be slanted with respect to the vertical axis Z. The second direction E2 and the first direction E1 may be crossed. An angle $\beta$ between the second direction E2 and the vertical axis Z may be between about −10 degree and about −80 degree. Some of the first set of tilted insulating layers 301 and some of the second set of tilted insulating layers 303 may be crossed. Some other of the first set of tilted insulating layers 301 and some other of the second set of tilted insulating layers 303 may not crossed.

In some embodiments, an angle between the first direction E1 and the second direction E2 may be between about 20 degree and about 160 degree.

The first set of tilted insulating layers 301 and the second set of tilted insulating layers 303 may be formed of a same material. In some embodiments, the first set of tilted insulating layers 301 and the second set of tilted insulating layers 303 may be formed of a different material from that of the first insulating layer 107. In some embodiments, the first set of tilted insulating layers 301 and the second set of tilted insulating layers 303 may be formed of, for example, silicon nitride, silicon oxide, silicon oxynitride, silicon nitride oxide, flowable oxide, tonen silazen, undoped silica glass, borosilica glass, phosphosilica glass, borophosphosilica glass, plasma-enhanced tetra-ethyl orthosilicate, fluoride silicate glass, carbon-doped silicon oxide, organo silicate glass, or a combination thereof.

In some embodiments, the first set of tilted insulating layers 301 and the second set of tilted insulating layers 303 may be formed of, for example, a material having a lower dielectric constant than that of the first insulating layer 107. The first set of tilted insulating layers 301 and the second set of tilted insulating layers 303 formed of the material having the lower dielectric constant may reduce the parasitic capacitance between the conductive pillars 201-1, 201-3. That is, the first set of tilted insulating layers 301 and the second set of tilted insulating layers 303 formed of material having the lower dielectric constant may significantly alleviate an interference effect between electrical signals induced or applied to the conductive pillars 201-1, 201-3.

In some embodiments, the first set of tilted insulating layers 301 and the second set of tilted insulating layers 303 may be formed of a material having a coefficient of thermal expansion less than about 20 ppm/° C. and a Young's Modulus less than about 15 GPa. Specifically, the first set of tilted insulating layers 301 and the second set of tilted insulating layers 303 may be formed of a material including polyimide or an epoxy-based material. The first set of tilted insulating layers 301 and the second set of tilted insulating layers 303 may serve as a cushion to reduce a stress of a bumping process or a wiring process; therefore, the delamination of the first insulating layer 107 may be reduced.

With reference to FIG. 1, the pad layer 109 may be disposed on the first insulating layer 107. The pad layer 109 may cover the top surfaces of the conductive pillars 201-1, 201, the top surfaces 301TS of the first set of tilted insulating layers 301, and the top surfaces 303TS of the second set of tilted insulating layers 303. The pad layer 109 may be formed of, for example, aluminum, copper, titanium, tungsten, aluminum-copper alloy, aluminum alloy, or copper alloy.

FIGS. 2 to 9 illustrates, in schematic cross-sectional view diagrams, semiconductor devices 1B, 1C, 1D, 1E, 1F, 1G, 1H, and 1I in accordance with some embodiments of the present disclosure.

Figure 2:
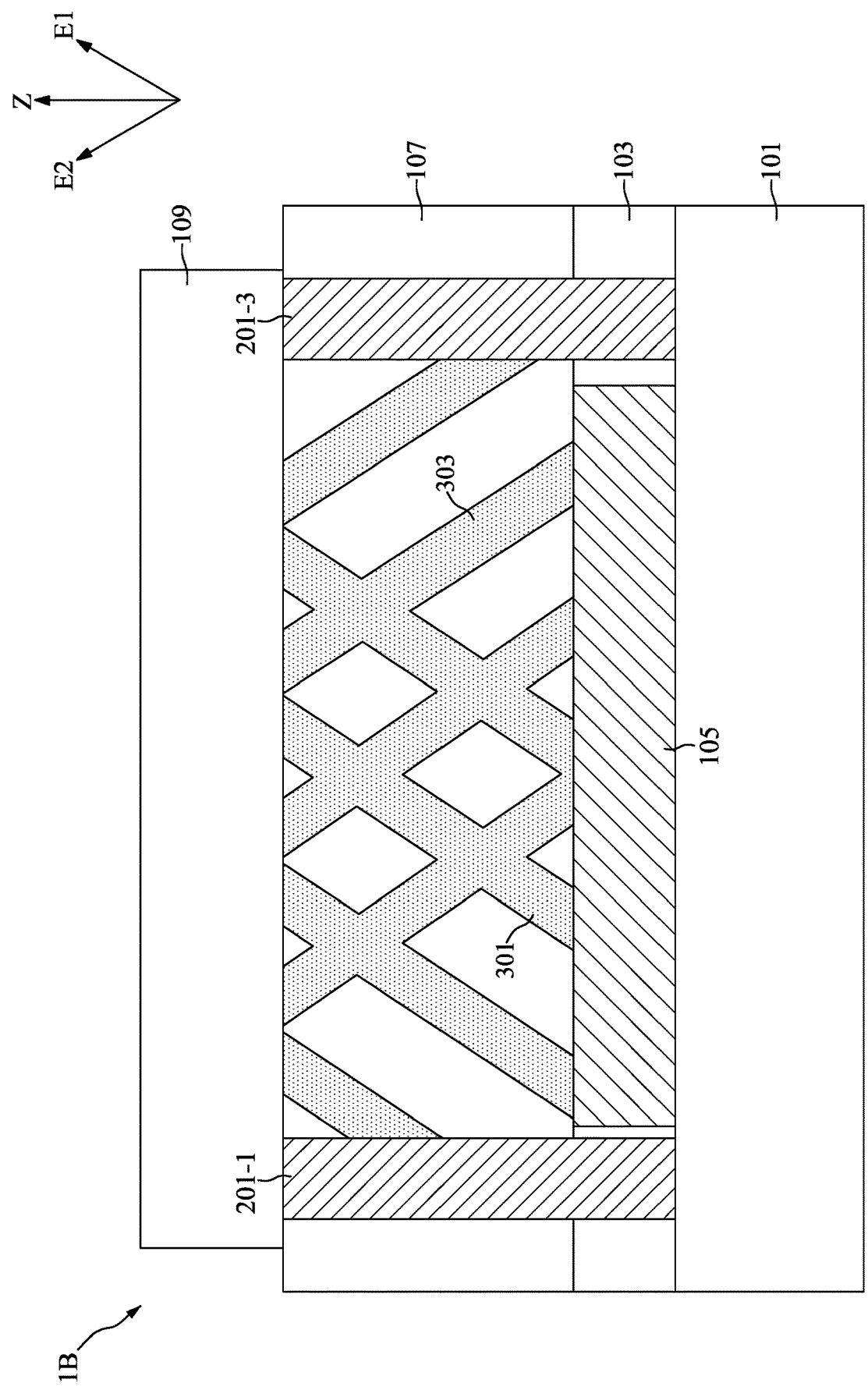
FIGS. 2 to 9 illustrates, in schematic cross-sectional view diagrams, semiconductor devices in accordance with some embodiments of the present disclosure.

With reference to FIG. 2, the semiconductor device 1B may have a structure similar to that illustrated in FIG. 1. The same or similar elements in FIG. 2 as in FIG. 1 have been marked with similar reference numbers and duplicative descriptions have been omitted.

With reference to FIG. 2, the bottom portions of the sidewalls of the conductive pillars 201-1, 201-3 may be distant from the bottom conductive layer 105. The first set of tilted insulating layers 301 and the second set of tilted insulating layers 303 may be disposed between the conductive pillars 201-1, 201-3.

Figure 3:
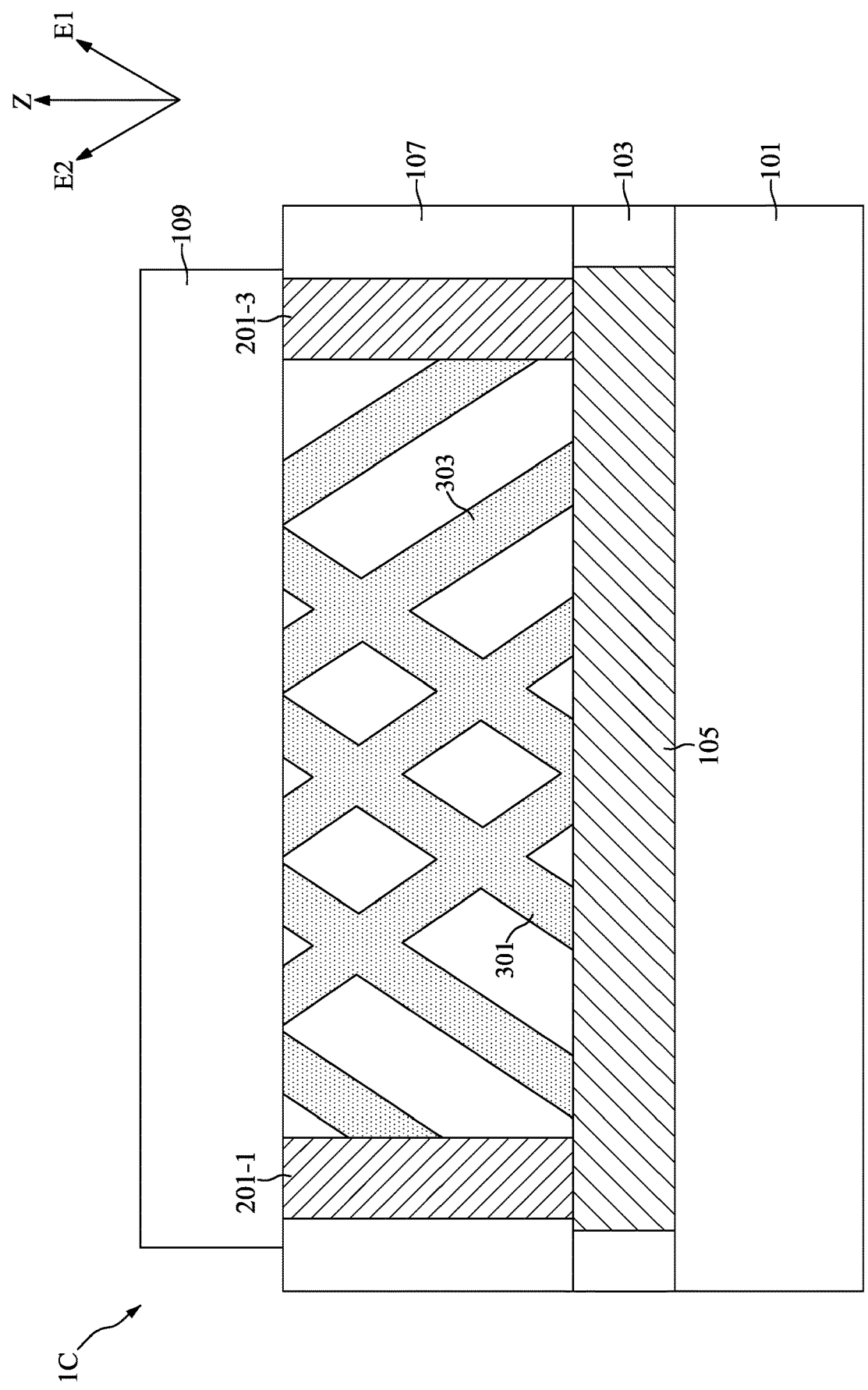

With reference to FIG. 3, the semiconductor device 1C may have a structure similar to that illustrated in FIG. 1. The same or similar elements in FIG. 3 as in FIG. 1 have been marked with similar reference numbers and duplicative descriptions have been omitted.

With reference to FIG. 3, the conductive pillars 201-1, 201-3 may be disposed along the first insulating layer 107 and disposed on the bottom conductive layer 105. The first set of tilted insulating layers 301 and the second set of tilted insulating layers 303 may be disposed between the conductive pillars 201-1, 201-3.

Figure 4:
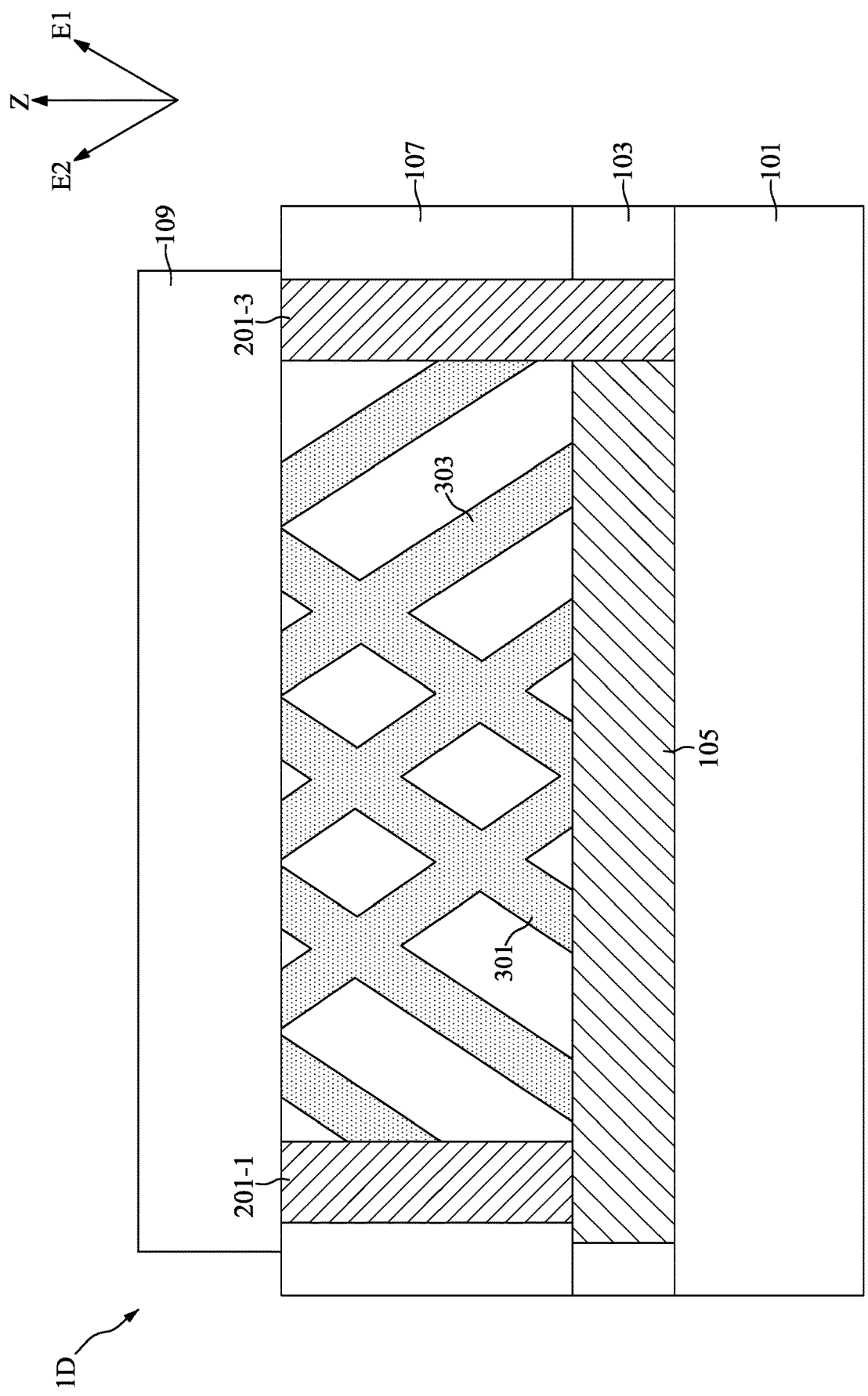

With reference to FIG. 4, the semiconductor device 1D may have a structure similar to that illustrated in FIG. 1. The same or similar elements in FIG. 4 as in FIG. 1 have been marked with similar reference numbers and duplicative descriptions have been omitted.

With reference to FIG. 4, the conductive pillar 201-1 may be disposed along the first insulating layer 107 and disposed on the bottom conductive layer 105. The conductive pillar 201-3 may be disposed along the first insulating layer 107 and the bottom conductive layer 105. The bottom portion of the sidewall of the conductive pillar 201-3 may be attached on the bottom conductive layer 105. The first set of tilted insulating layers 301 and the second set of tilted insulating layers 303 may be disposed between the conductive pillars 201-1, 201-3.

Figure 5:
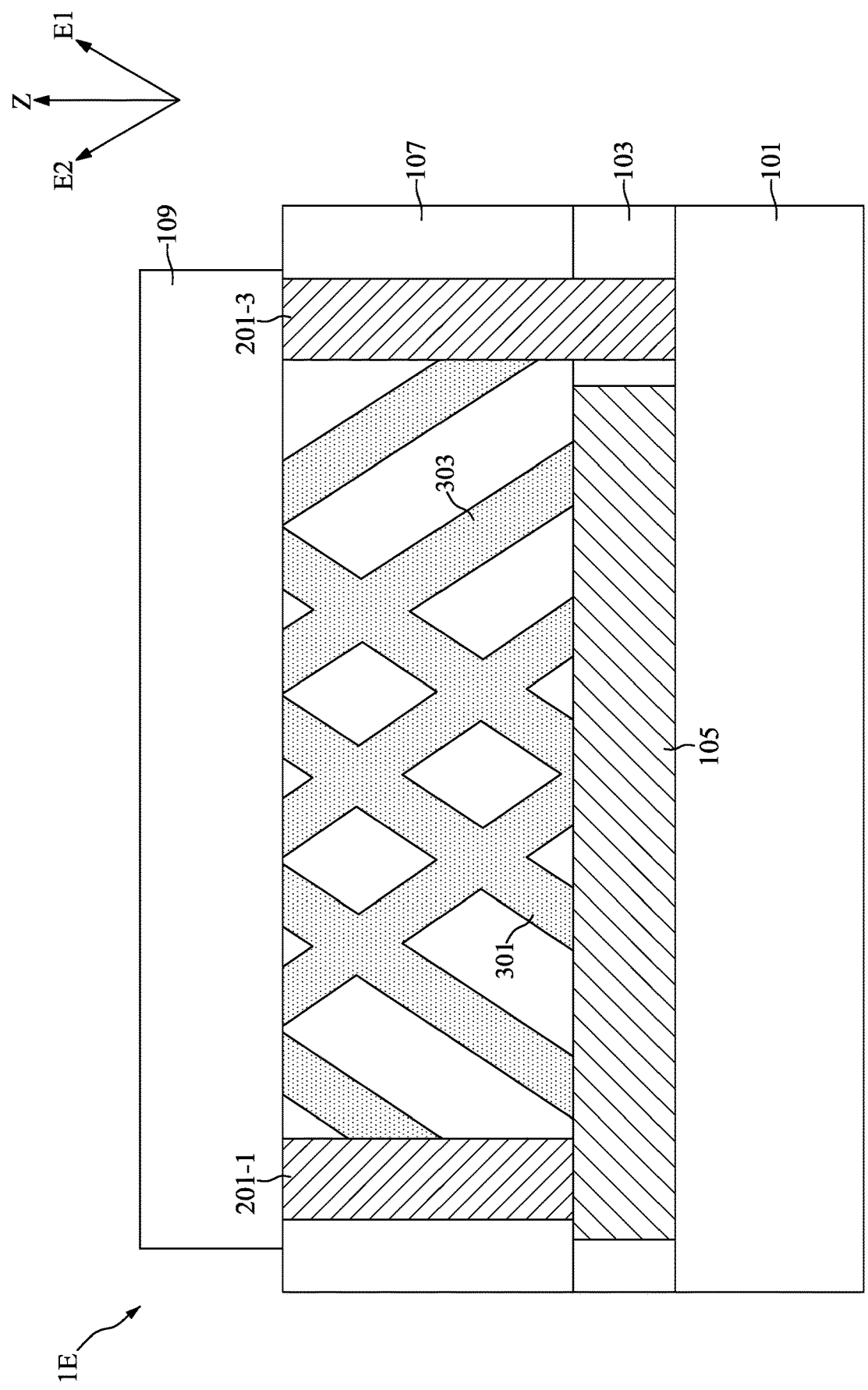

With reference to FIG. 5, the semiconductor device 1E may have a structure similar to that illustrated in FIG. 4. The same or similar elements in FIG. 5 as in FIG. 4 have been marked with similar reference numbers and duplicative descriptions have been omitted.

With reference to FIG. 5, the bottom portion of the sidewall of the conductive pillar 201-3 may be distant from the bottom conductive layer 105. In some embodiments, the conductive pillar 201-3 may be electrically isolated from the bottom conductive layer 105. The first set of tilted insulating layers 301 and the second set of tilted insulating layers 303 may be disposed between the conductive pillars 201-1, 201-3. The conductive pillar 201-3 may improve the mechanical strength of the semiconductor device 1E.

Figure 6:
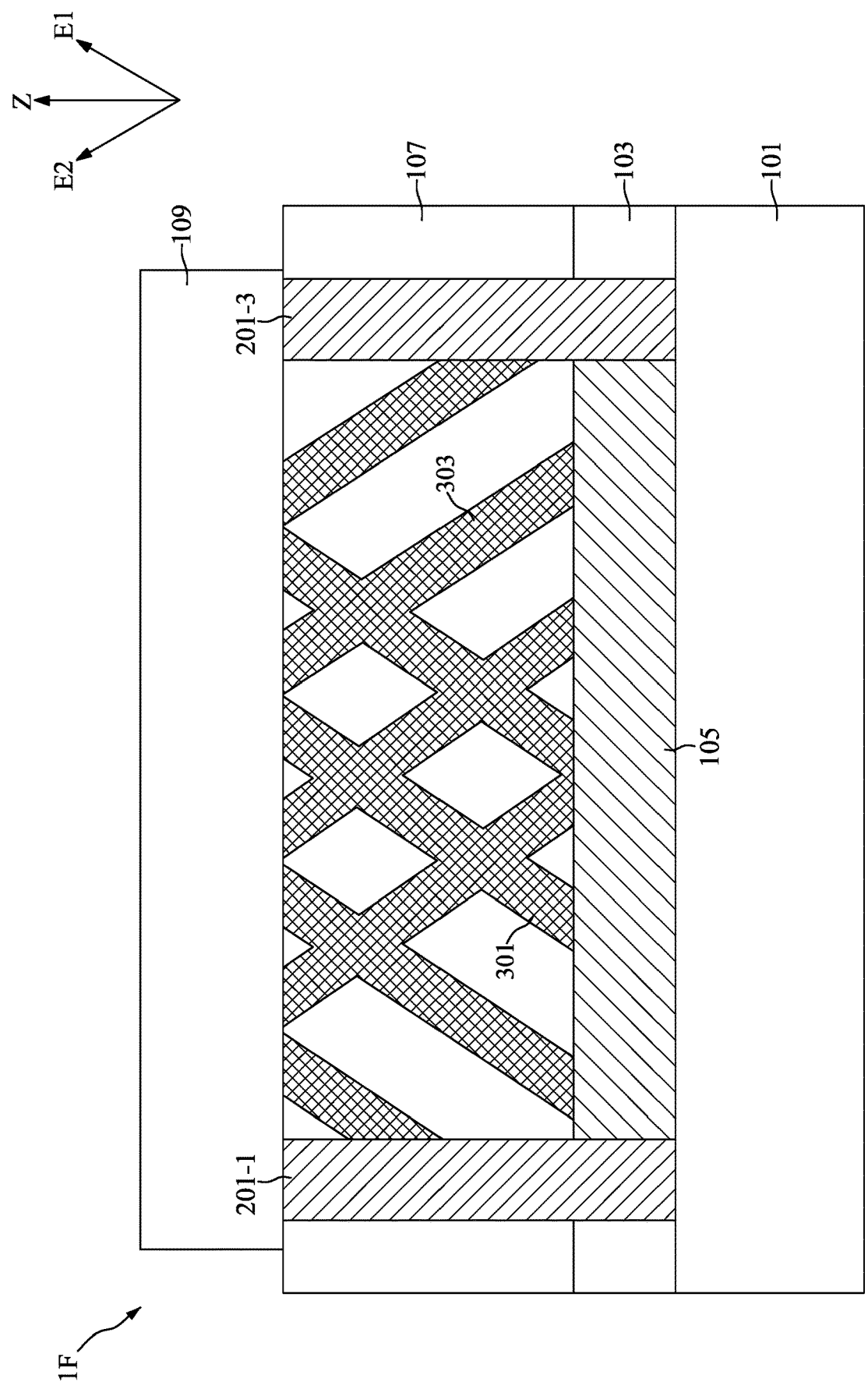

With reference to FIG. 6, the semiconductor device 1F may have a structure similar to that illustrated in FIG. 1. The same or similar elements in FIG. 6 as in FIG. 1 have been marked with similar reference numbers and duplicative descriptions have been omitted.

With reference to FIG. 6, the first set of tilted insulating layers 301 and the second set of tilted insulating layers 303 may be porous. Porosities of the first set of tilted insulating layers 301 and the second set of tilted insulating layers 303 may be between about 10% and about 80%. The first set of tilted insulating layers 301 and the second set of tilted insulating layers 303 may include a skeleton and a plurality of empty spaces disposed among the skeleton. The plurality of empty spaces may connect to each other and may be filled with air. The skeleton may include, for example, silicon oxide, low-dielectric materials, or methylsilsesquioxane. The plurality of empty spaces of the first set of tilted insulating layers 301 and the second set of tilted insulating layers 303 may be filled with air. As a result, a dielectric constant of the first set of tilted insulating layers 301 and the second set of tilted insulating layers 303 may be significantly lower than a layer formed of, for example, silicon oxide. Therefore, the first set of tilted insulating layers 301 and the second set of tilted insulating layers 303 may significantly reduce the parasitic capacitance between the conductive pillars 201-1, 201-3. That is, the first set of tilted insulating layers 301 and the second set of tilted insulating layers 303 may significantly alleviate an interference effect between electrical signals induced or applied to the conductive pillars 201-1, 201-3.

Figure 7:
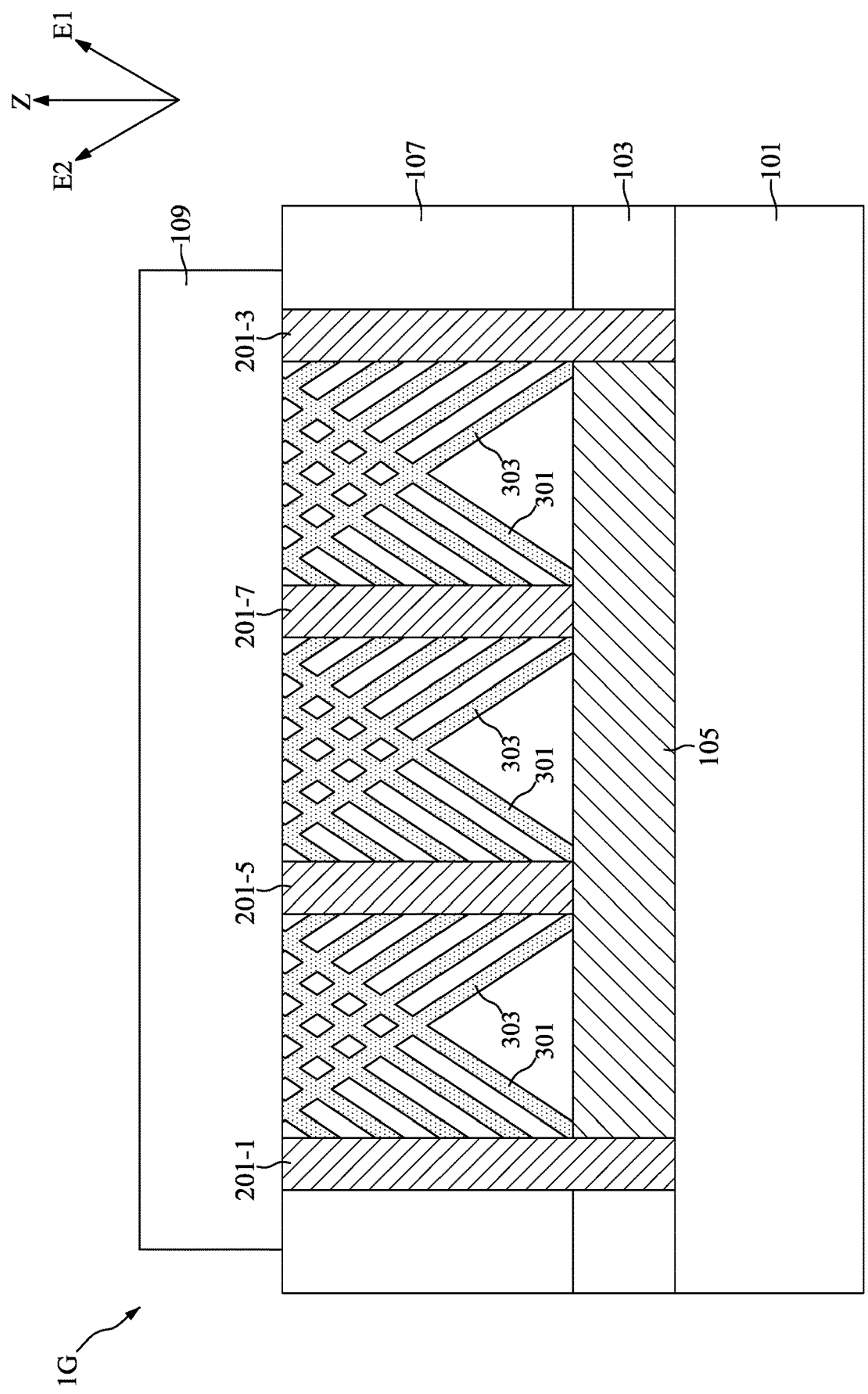

With reference to FIG. 7, the semiconductor device 1G may have a structure similar to that illustrated in FIG. 1. The same or similar elements in FIG. 7 as in FIG. 1 have been marked with similar reference numbers and duplicative descriptions have been omitted.

With reference to FIG. 7, more conductive pillars may be disposed in the semiconductor device 1G. For example, the conductive pillars 201-1, 201-3 may be disposed along the first insulating layer 107 and the bottom insulating layer 103. The conductive pillars 201-5, 201-7 may be disposed along the first insulating layer 107 and may be disposed on the bottom conductive layer 105. The first set of tilted insulating layers 301 and the second set of tilted insulating layers 303 may be respectively correspondingly disposed between adjacent pairs of the conductive pillars 201-1, 201-3, 201-5, 201-7.

Figure 8:
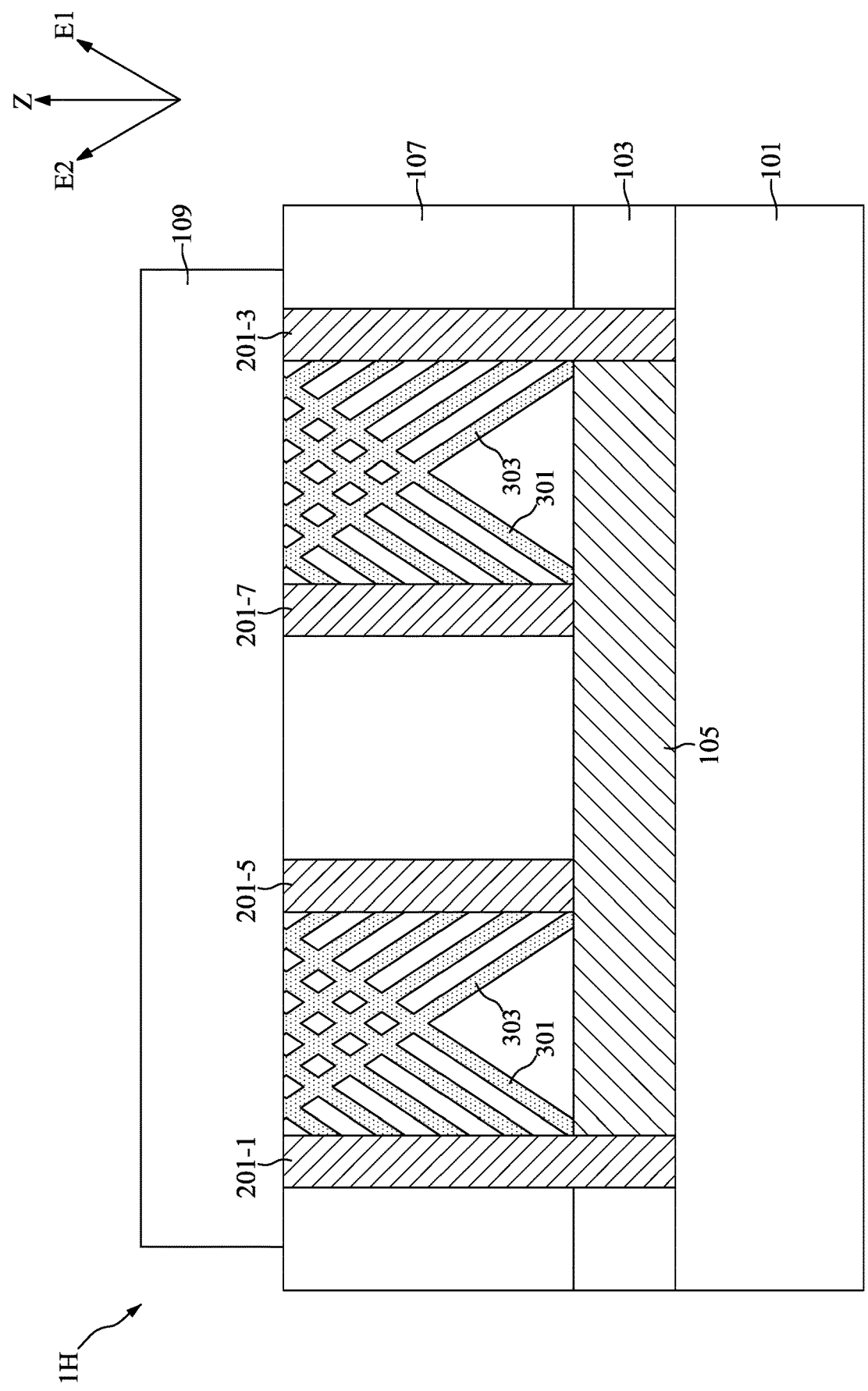

With reference to FIG. 8, the semiconductor device 1H may have a structure similar to that illustrated in FIG. 7. The same or similar elements in FIG. 8 as in FIG. 7 have been marked with similar reference numbers and duplicative descriptions have been omitted.

With reference to FIG. 8, the first set of tilted insulating layers 301 and the second set of tilted insulating layers 303 may be only disposed in some of the adjacent pairs of the conductive pillars 201-1, 201-3, 201-5, 201-7. For example, in the present embodiment, the first set of tilted insulating layers 301 and the second set of tilted insulating layers 303 may be only disposed between the conductive pillars 201-1, 201-5 and between the conductive pillars 201-7, 201-3.

Figure 9:
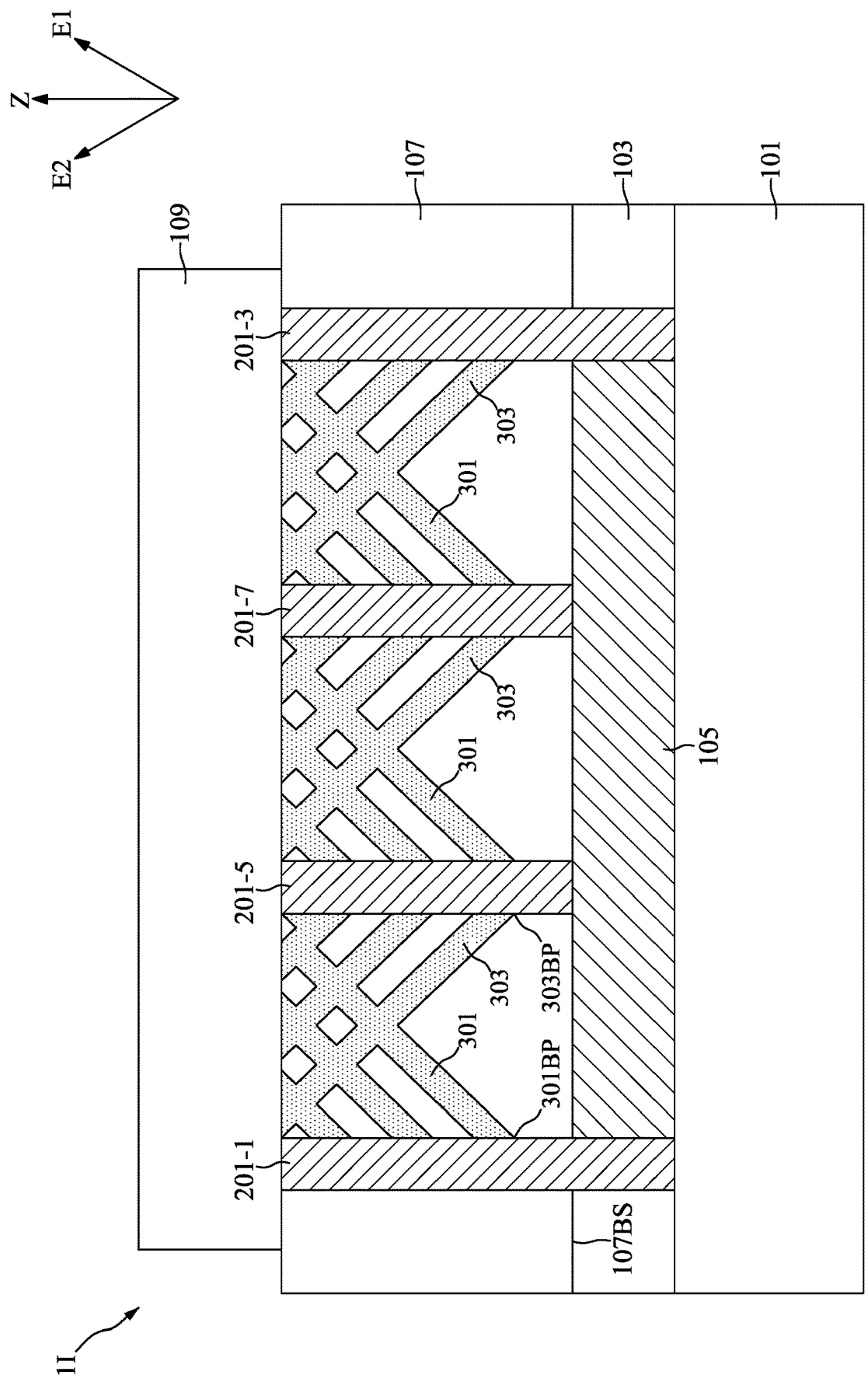

With reference to FIG. 9, the semiconductor device 1I may have a structure similar to that illustrated in FIG. 7. The same or similar elements in FIG. 9 as in FIG. 7 have been marked with similar reference numbers and duplicative descriptions have been omitted.

With reference to FIG. 9, the bottommost points 301BP of the first set of tilted insulating layers 301 and the bottommost points 303BP of the second set of tilted insulating layers 303 may be at a vertical level above a vertical level of the bottom surface 107BS of the first insulating layer 107.

Figure 10:
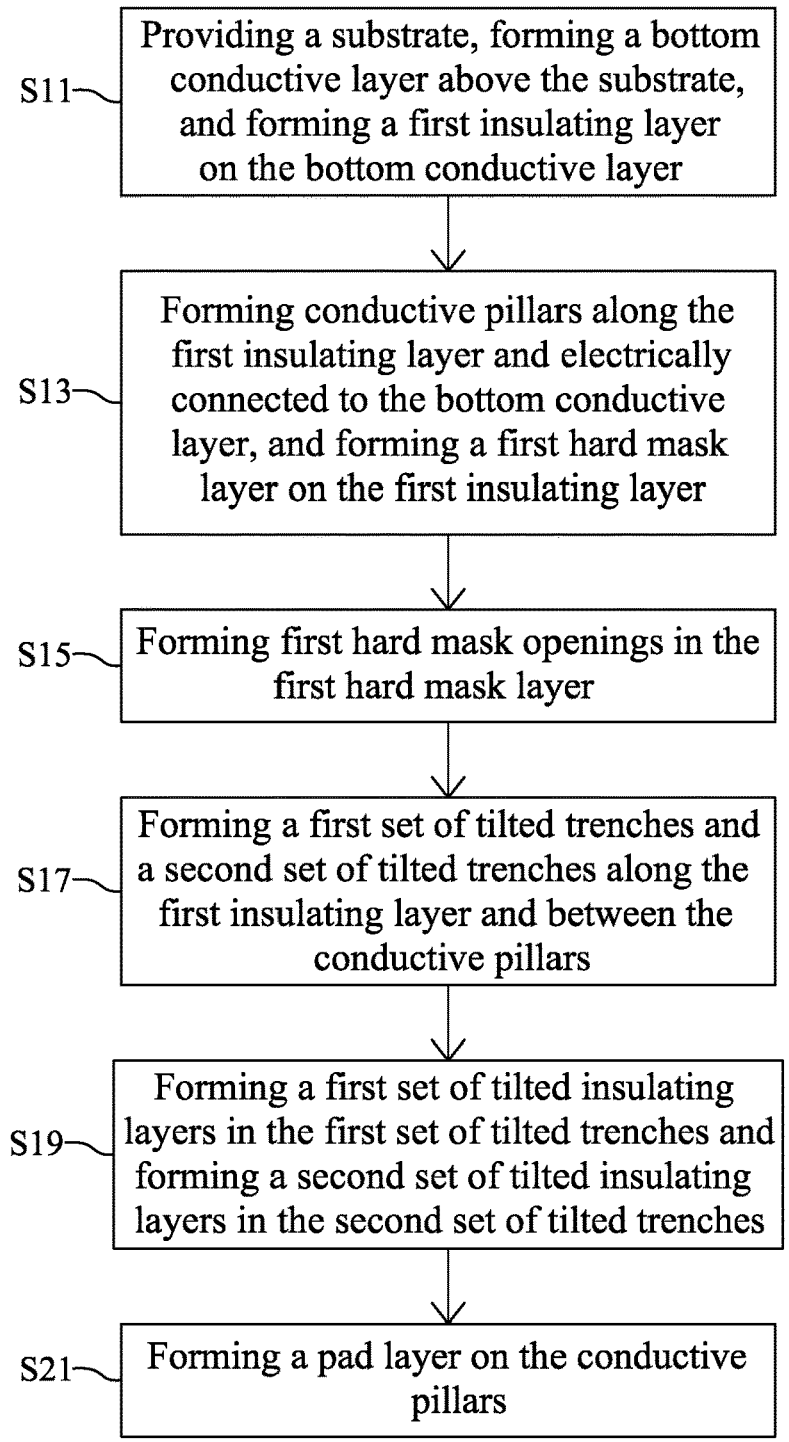
FIG. 10 illustrates, in a flowchart diagram form, a method for fabricating a semiconductor device in accordance with one embodiment of the present disclosure.

FIG. 10 illustrates, in a flowchart diagram form, a method 10 for fabricating a semiconductor device 1A in accordance with one embodiment of the present disclosure. FIGS. 11 to 19 illustrate, in schematic cross-sectional view diagrams, a flow for fabricating the semiconductor device 1A in accordance with one embodiment of the present disclosure.

Figure 11:
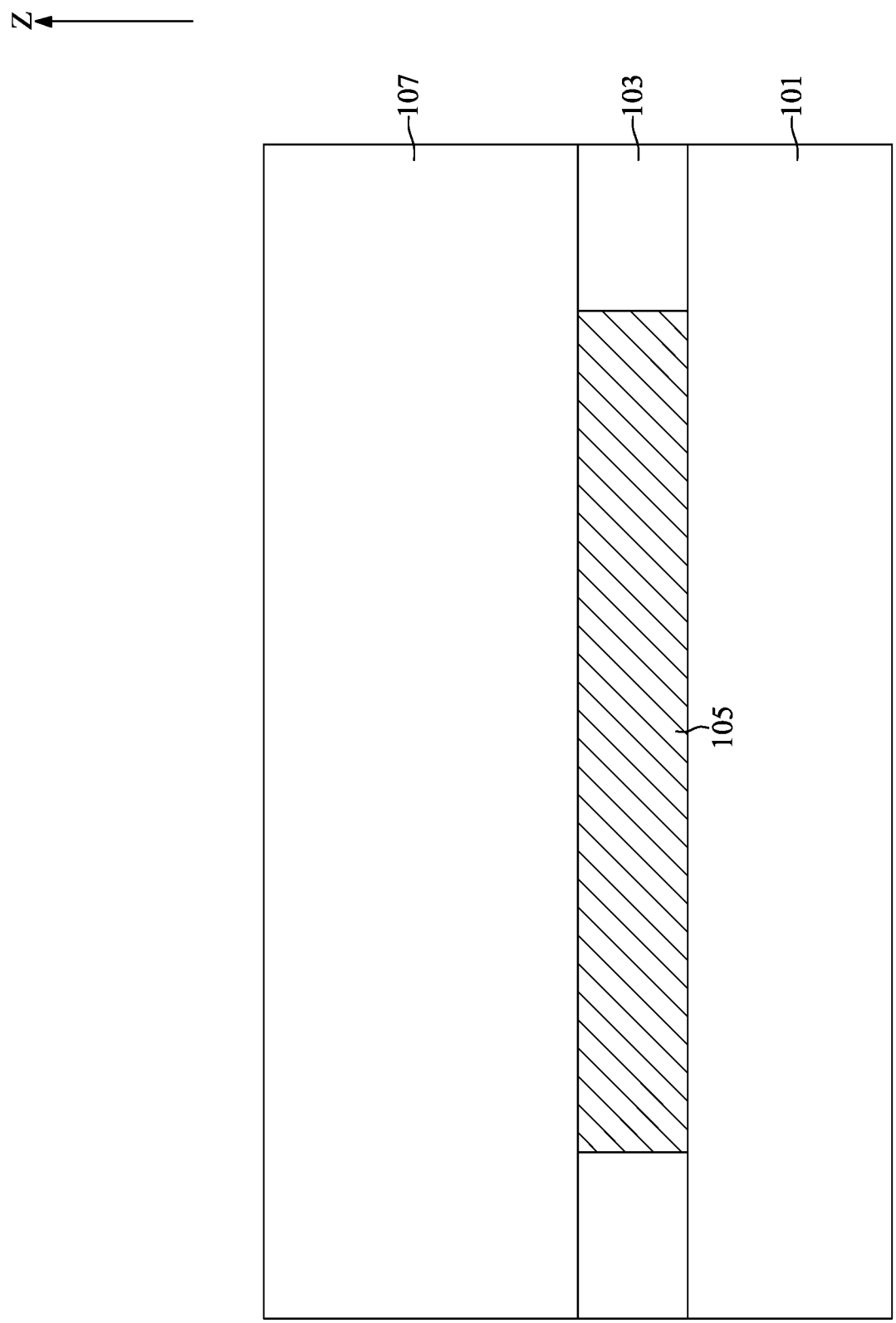
FIGS. 11 to 19 illustrate, in schematic cross-sectional view diagrams, a flow for fabricating the semiconductor device in accordance with one embodiment of the present disclosure.

With reference to FIGS. 10 and 11, at step S11, a substrate 101 may be provided, a bottom conductive layer 105 may be formed above the substrate 101, and a first insulating layer 107 may be formed on the bottom conductive layer 105.

With reference to FIG. 11, a bottom insulating layer 103 may be formed on the substrate 101. The bottom insulating layer 103 may be formed by a deposition process such as chemical vapor deposition, plasma enhanced chemical vapor deposition, low pressure chemical vapor deposition, or the like. The bottom conductive layer 105 may be formed in the bottom insulating layer 103 by a damascene process. The first insulating layer 107 may be formed on the bottom conductive layer 105 and the bottom insulating layer 103 with a procedure similar to the formation of the bottom insulating layer 103.

Figure 12:
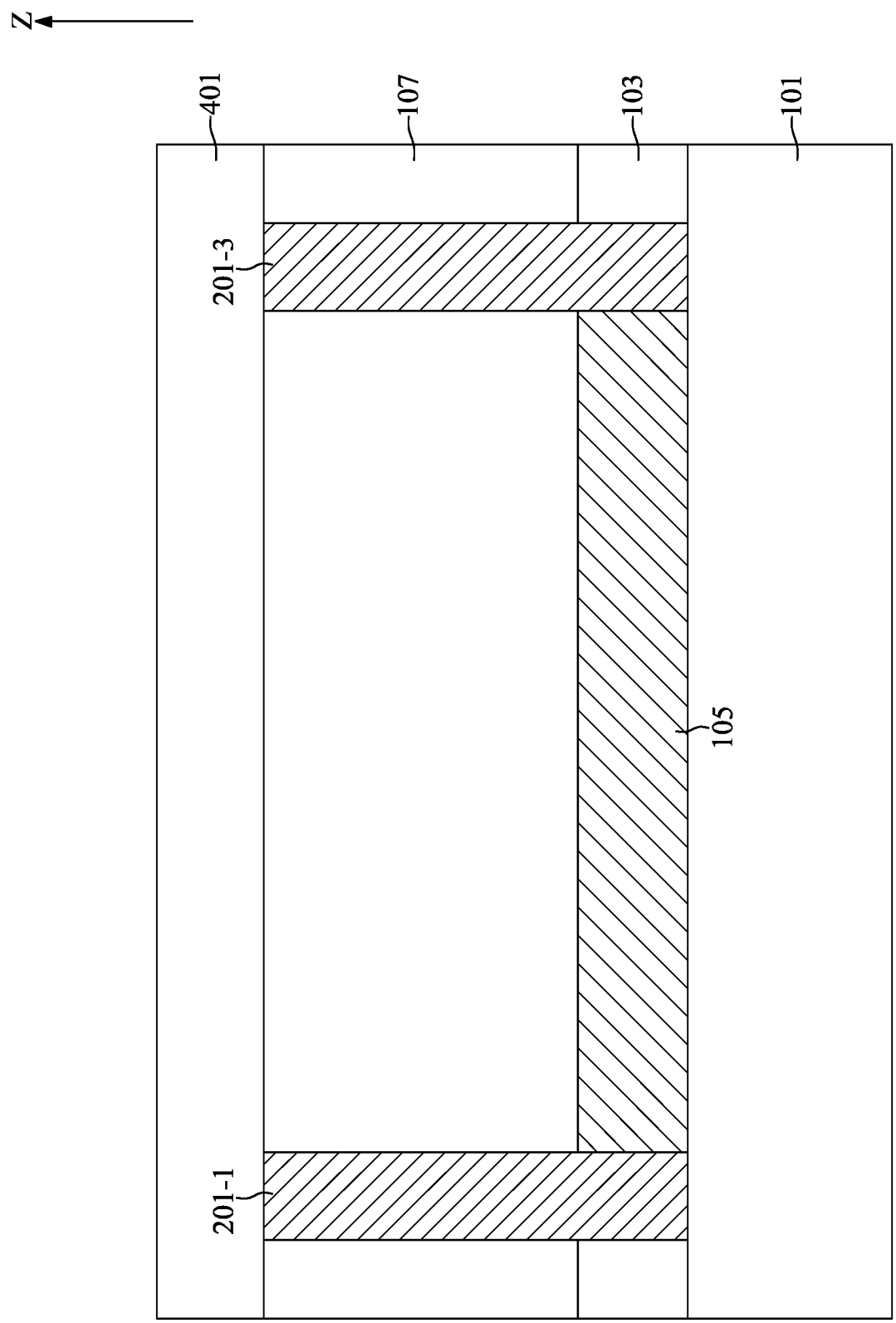

With reference to FIGS. 10 and 12, at step S13, conductive pillars 201-1, 201-3 may be formed along the first insulating layer 107 and electrically connected to the bottom conductive layer 105, and a first hard mask layer 401 may be formed on the first insulating layer 107.

With reference to FIG. 12, a photolithography process may be performed to define a desire pattern of the conductive pillars 201-1, 201-3. A following etch process, such as anisotropic dry etch process, may be proceeded to form openings vertically along the first insulating layer 107 and the bottom insulating layer 103. A conductive material such as tungsten, cobalt, zirconium, tantalum, titanium, aluminum, ruthenium, copper, metal carbides (e.g., tantalum carbide, titanium carbide, tantalum magnesium carbide), metal nitrides (e.g., titanium nitride), transition metal aluminides, or combinations thereof may be completely filled the openings. Subsequently, a planarization process, such as chemical mechanical polishing, may be performed until the top surface of the first insulating layer 107 is exposed to remove excess material, provide a substantially flat surface for subsequent processing steps, and concurrently form the conductive pillars 201-1, 201-3.

In some embodiments, the first hard mask layer 401 may be formed of, for example, silicon oxide, silicon nitride, silicon oxynitride, silicon nitride oxide, the like, or a combination thereof. The first hard mask layer 401 may be formed by deposition processes such as chemical vapor deposition, plasma enhanced chemical vapor deposition, low pressure chemical vapor deposition, or the like.

It should be noted that, in description of the present disclosure, silicon oxynitride refers to a substance which contains silicon, nitrogen, and oxygen and in which a proportion of oxygen is greater than that of nitrogen. Silicon nitride oxide refers to a substance which contains silicon, oxygen, and nitrogen and in which a proportion of nitrogen is greater than that of oxygen.

Alternatively, in some embodiments, the first hard mask layer 401 may be formed of, for example, boron nitride, silicon boron nitride, phosphorus boron nitride, or boron carbon silicon nitride. The first hard mask layer 401 may be formed by a film formation process and a treatment process. Specifically, in the film formation process, first precursors, which may be boron-based precursors, may be introduced over the first insulating layer 107 to form a boron-based layer. Subsequently, in the treatment process, second precursors, which may be nitrogen-based precursors, may be introduced to react with the boron-based layer and turn the boron-based layer into the first hard mask layer 401.

In some embodiments, the first precursors may be, for example, diborane, borazine, or an alkyl-substituted derivative of borazine. In some embodiments, the first precursors may be introduced at a flow rate between about 5 sccm (standard cubic centimeters per minute) and about 50 slm (standard liter per minute); specifically, between about 10 sccm and about 1 slm. In some embodiments, the first precursors may be introduced by dilution gas such as nitrogen, hydrogen, argon, or a combination thereof. The dilution gas may be introduced at a flow rate between about 5 sccm and about 50 slm; specifically, between about 1 slm and about 10 slm.

In some embodiments, the film formation process may be performed without an assistant of plasma. In such situation, a substrate temperature of the film formation process may be between about 100° C. and about 1000° C. For example, the substrate temperature of the film formation process may be between about 300° C. and about 500° C. A process pressure of the film formation process may be between about 10 mTorr and about 760 Torr. For example, the process pressure of the film formation process may be between about 2 Torr and about 10 Torr.

In some embodiments, the film formation process may be performed in the presence of plasma. In such situation, a substrate temperature of the film formation process may be between about 100° C. and about 1000° C. For example, the substrate temperature of the film formation process may be between about 300° C. and about 500° C. A process pressure of the film formation process may be between about 10 mTorr and about 760 Torr. For example, the process pressure of the film formation process may be between about 2 Torr and about 10 Torr. The plasma may be provided by a RF power between 2 W and 5000 W. For example, the RF power of the plasma may be between 30 W and 1000 W.

In some embodiments, the second precursors may be, for example, ammonia or hydrazine. In some embodiments, the second precursors may be introduced at a flow rate between about 5 sccm and about 50 slm; specifically, between about 10 sccm and about 1 slm.

In some embodiments, oxygen-based precursors may be together introduced with the second precursors in the treatment process. The oxygen-based precursors may be, for example, oxygen, nitric oxide, nitrous oxide, carbon dioxide, or water.

In some embodiments, silicon-based precursors may be together introduced with the second precursors in the treatment process. The silicon-based precursors may be, for example, silane, trisilylamine, trimethylsilane, or silazanes (e.g., hexamethylcyclotrisilazane).

In some embodiments, phosphorus-based precursors may be together introduced with the second precursors in the treatment process. The phosphorus-based precursors may be, for example, phosphine.

In some embodiments, oxygen-based precursors, silicon-based precursors, or phosphorus-based precursors may be together introduced with the second precursors in the treatment process.

In some embodiments, the treatment process may be performed with an assistant of a plasma process, an UV cure process, a thermalannealprocess, or a combination thereof.

When the treatment is performed with the assistant of the plasma process. Plasma of the plasma process may be provided by the RF power. In some embodiments, the RF power may be between about 2 W and about 5000 W at a single low frequency of between about 100 kHz up to about 1 MHz. In some embodiments, the RF power may be between about 30 W and about 1000 W at a single high frequency of greater than about 13.6 MHz. In such situation, a substrate temperature of the treatment process may be between about 20° C. and about 1000° C. A process pressure of the treatment process may be between about 10 mTorr and about 760 Torr.

When the treatment is performed with the assistant of UV cure process, in such situation, a substrate temperature of the treatment process may be between about 20° C. and about 1000° C. A process pressure of the treatment process may be between about 10 mTorr and about 760 Torr. The UV cure may be provided by any UV source, such as mercury microwave arc lamps, pulsed xenon flash lamps, or high-efficiency UV light emitting diode arrays. The UV source may have a wavelength of between about 170 nm and about 400 nm. The UV source may provide a photon energy between about 0.5 eV and about 10 eV; specifically, between about 1 eV and about 6 eV. The assistant of the UV cure process may remove hydrogen from the first hardmask layer 401. As hydrogen may diffuse through into other areas of the semiconductor device 1A and may degrade the reliability of the semiconductor device 1A, the removal of hydrogen by the assistant of UV cure process may improve the reliability of the semiconductor device 1A. In addition, the UV cure process may increase the density of the first hardmask layer 401.

When the treatment is performed with the assistant of the thermal anneal process. In such situation, a substrate temperature of the treatment process may be between about 20° C. and about 1000° C. A process pressure of the treatment process may be between about 10 mTorr and about 760 Torr.

Alternatively, in some embodiments, the first hard mask layer 401 may be formed of, for example, a carbon film. The terms "carbon film" is used herein to describe materials whose mass is primarily carbon, whose structure is defined primarily by carbon atoms, or whose physical and chemical properties are dominated by its carbon content. The term "carbon film" is meant to exclude materials that are simply mixtures or compounds that include carbon, for example dielectric materials such as carbon-doped silicon oxynitride, carbon-doped silicon oxide or carbon-doped polysilicon. These terms do include, for example, graphite, charcoal and halocarbons.

In some embodiments, the carbon film may be deposited by a process including introducing a processing gas mixture, consisting of one or more hydrocarbon compounds, into a processing chamber. The hydrocarbon compound has a formula $C_xH_y$, where x has a range of between 2 and 4 and y has a range of between 2 and 10. The hydrocarbon compounds may be, for example, propylene ($C_3H_6$), propyne ($C_3H_4$), propane ($C_3H_8$), butane ($C_4H_{10}$), butylene ($C_4H_8$), butadiene ($C_4H_6$), or acetylene ($C_2H_2$), or a combination thereof. In some embodiments, partially or completely fluorinated derivatives of the hydrocarbon compounds may be used. The doped derivatives include boron-containing derivatives of the hydrocarbon compounds as well as fluorinated derivatives thereof.

In some embodiments, the carbon film may be deposited from the processing gas mixture by maintaining a substrate temperature between about 100° C. and about 700° Q specifically, between about 350° C. and about 550° C. In some embodiments, the carbon film may be deposited from the processing gas mixture by maintaining a chamber pressure between about 1 Torr and about 20 Torr. In some embodiments, the carbon film may be deposited from the processing gas mixture by introducing the hydrocarbon gas, and any inert, or reactive gases respectively, at a flow rate between about 50 sccm and about 2000 sccm.

In some embodiments, the processing gas mixture may further include an inert gas, such as argon. However, other inert gases, such as nitrogen or other noble gases, such as helium may also be used. Inert gases may be used to control the density and deposition rate of the carbon film. Additionally, a variety of gases may be added to the processing gas mixture to modify properties of the carbon film. The gases may be reactive gases, such as hydrogen, ammonia, a mixture of hydrogen and nitrogen, or a combination thereof. The addition of hydrogen or ammonia may be used to control the hydrogen ratio of the carbon film to control layer properties, such as etch selectivity, chemical mechanical polishing resistance properties, and reflectivity. In some embodiments, a mixture of reactive gases and inert gases may be added to the processing gas mixture to deposit the carbon film.

The carbon film may include carbon and hydrogen atoms, which may be an adjustable carbon:hydrogen ratio that ranges from about 10% hydrogen to about 60% hydrogen. Controlling the hydrogen ratio of the carbon film may tune the respective etch selectivity and chemical mechanical polishing resistance properties. As the hydrogen content decreases, the etch resistance, and thus the selectivity, of the carbon film increases. The reduced rate of removal of the carbon film may make the carbon film suitable for being a mask layer when performing an etch process to transfer desire pattern onto the underlying layers.

Figure 13:
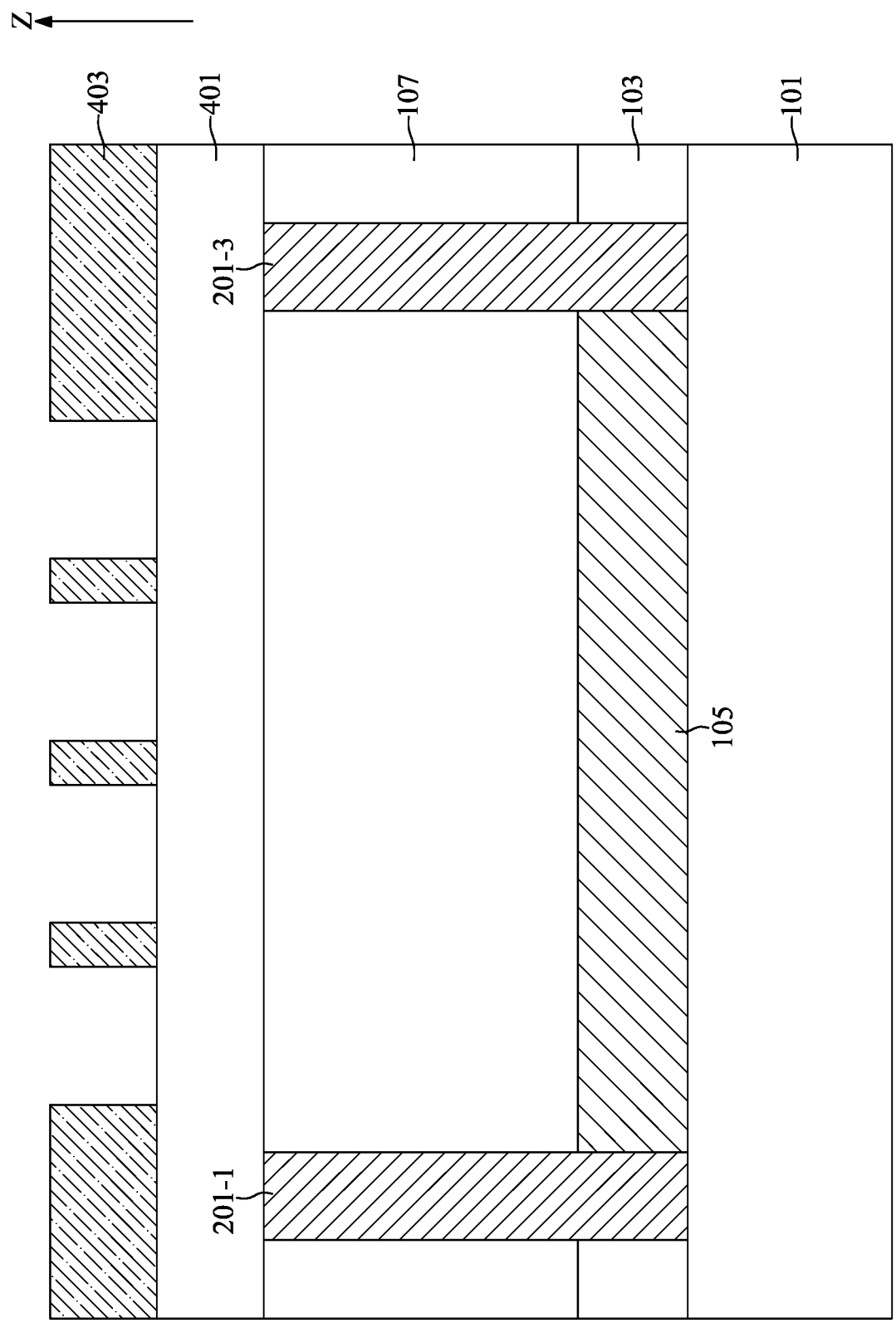
Figure 14:
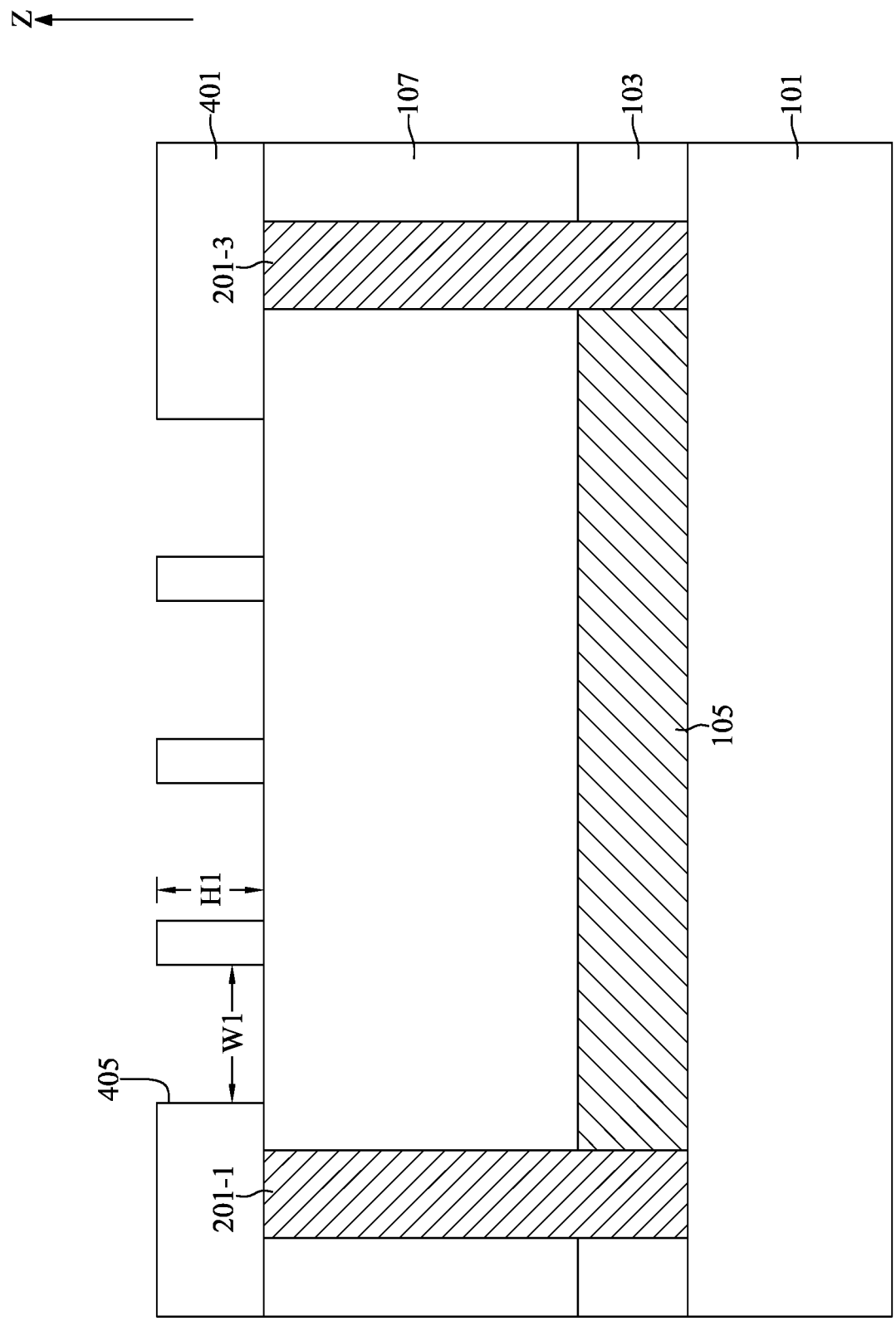

With reference to FIGS. 10, 13, and 14, at step S15, first hard mask openings 405 may be formed in the first hard mask layer 401.

With reference to FIG. 13, a first mask layer 403 may be formed on the first hard mask layer 401. The first mask layer 403 may be a photoresist layer. The first mask layer 403 may be patterned by a photolithography process.

With reference to FIG. 14, an etch process, such as an anisotropic dry etch process, may be performed to remove portions of the first hard mask layer 401 and concurrently form the first hard mask openings 405. In some embodiments, the etch rate of the first hard mask layer 401 of the etch process may be faster than the etch rate of the first insulating layer 107 of the etch process. For example, an etch rate ratio of the first hard mask layer 401 to the first insulating layer 107 may be between about 100:1 and about 1.05:1, between about 100:1 and about 10:1, between about 50:1 and about 10:1, between about 30:1 and about 10:1, between about 20:1 and about 10:1, or between about 15:1 and about 10:1 during the etch process. In some embodiments, a ratio of the width W1 of the first hard mask openings 405 to the height H1 of the first hard mask openings 405 may be between about 5:1 and about 1:15, between about 3:1 and about 1:13, between about 1:1 and about 1:11, and between about 5:1 and about 1:8.

Figure 15:
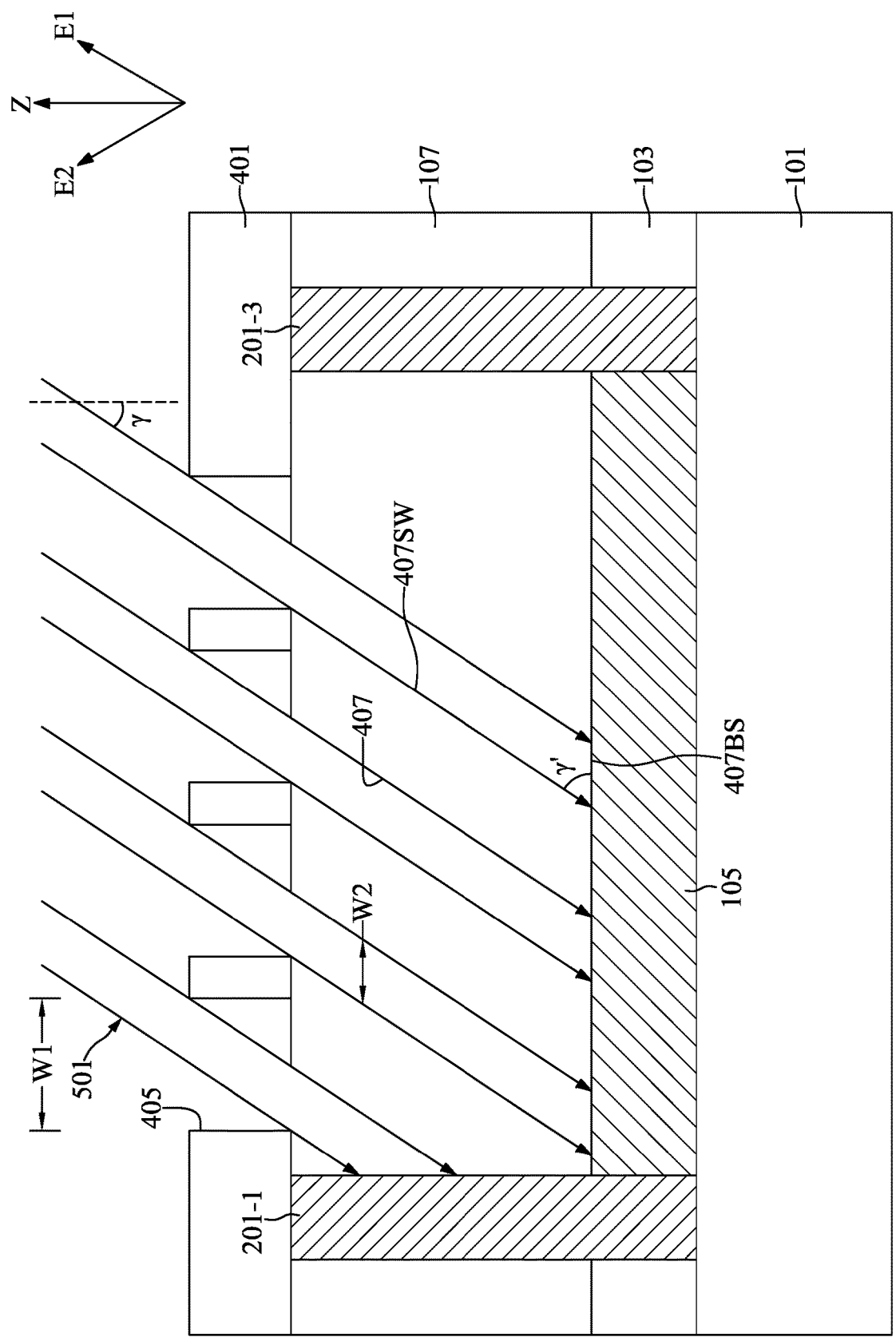
Figure 16:
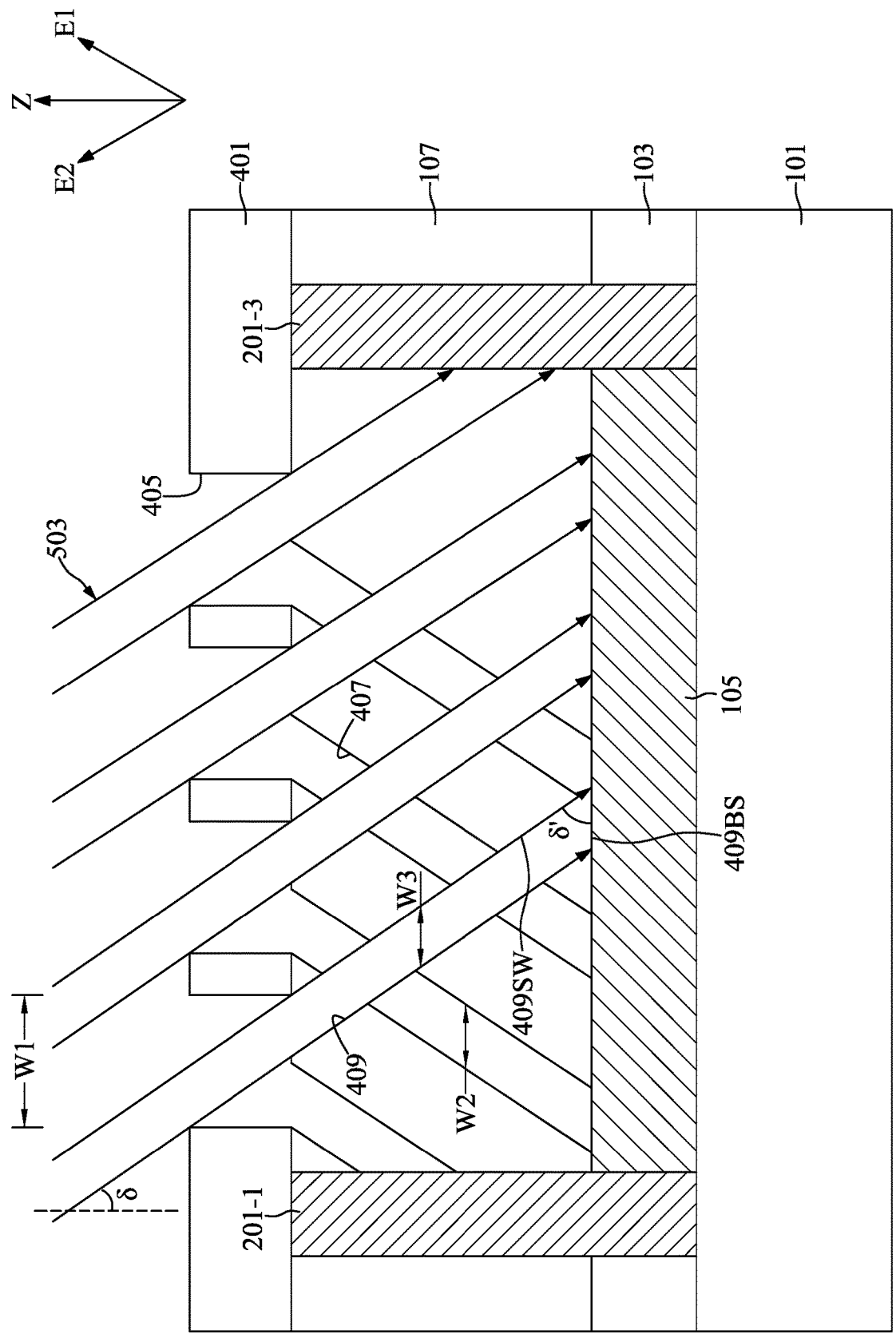

With reference to FIGS. 10, 15, and 16, at step S17, a first set of tilted trenches 407 and a second set of tilted trenches 409 may be formed along the first insulating layer 107 and between the conductive pillars 201-1, 201-3.

With reference to FIG. 15, a first tilted etch process 501 may be performed to form the first set of tilted trenches 407 along the first insulating layer 107. The first tilted etch process 501 may use the first hard mask layer 401 and the first hard mask openings 405 as pattern guides. In some embodiments, the angle of incidence γ of the first tilted etch process 501 may be define by the width W1 of the first hard mask openings 405 and the height H1 of the first hard mask openings 405. In some embodiments, the angle of incidence γ of the first tilted etch process 501 may be between about 10 degree and about 80 degree. In some embodiments, the angle of incidence γ of the first tilted etch process 501 may be between about 20 degree and about 60 degree. In some embodiments, the angle of incidence γ of the first tilted etch process 501 may be between about 20 degree and about 40 degree.

In some embodiments, the first tilted etch process 501 may be an anisotropic etch process such as a reactive ion etching process. The reactive ion etching process may include etchant gases and passivation gases which may suppress the isotropic effect to limit the removal of material in the horizontal direction. The etchant gases may include chlorine gas and boron trichloride. The passivation gases may include fluoroform or other suitable halocarbons. In some embodiments, the first hard mask layer 401 formed of carbon film may serve as a halocarbon source for the passivation gases of the reactive ion etching process.

In some embodiments, the etch rate of the first insulating layer 107 of the first tilted etch process 501 may be faster than the etch rate of the first hard mask layer 401 of the first tilted etch process 501. For example, an etch rate ratio of the first insulating layer 107 to the first hardmask layer 401 may be between about 100:1 and about 1.05:1, between about 100:1 and about 10:1, between about 50:1 and about 10:1, between about 30:1 and about 10:1, between about 20:1 and about 10:1, or between about 15:1 and about 10:1 during the first tilted etch process 501. In some embodiments, an etch rate ratio of the first insulating layer 107 to the conductive pillars 201-1, 201-3 may be between about 100:1 and about 1.05:1, between about 100:1 and about 10:1, between about 50:1 and about 10:1, between about 30:1 and about 10:1, between about 20:1 and about 10:1, or between about 15:1 and about 10:1 during the first tilted etch process 501.

The first set of tilted trenches 407 may be extended along a first direction E1 slanted with respect to the vertical axis Z. An acute angle γ' between the sidewalls 407SW of the first set of tilted trenches 407 and the bottom surfaces 407BS of the first set of tilted trenches 407 may be between about 10 degree and about 80 degree. The width W2 of the first set of tilted trenches 407 may be less than the width W1 of the first hard mask openings 405.

With reference to FIG. 16, a second tilted etch process 503 may be performed to form the second set of tilted trenches 409 along the first insulating layer 107. The second tilted etch process 503 may use the first hard mask layer 401 and the first hard mask openings 405 as pattern guides. In some embodiments, the angle of incidence δ of the second tilted etch process 503 may be opposite to the angle of incidence γ of the first tilted etch process 501 with respect to the vertical axis Z and may be define by the width W1 of the first hard mask openings 405 and the height H1 of the first hard mask openings 405. In some embodiments, the angle of incidence δ of the second tilted etch process 503 may be different from the angle of incidence γ of the first tilted etch process 501. In some embodiments, the angle of incidence δ of the second tilted etch process 503 may be between about −10 degree and about −80 degree.

In some embodiments, the second tilted etch process 503 may be an anisotropic etch process such as a reactive ion etching process. The etch rate of the first insulating layer 107 of the second tilted etch process 503 may be faster than the etch rate of the first hard mask layer 401 of the second tilted etch process 503. For example, an etch rate ratio of the first insulating layer 107 to the first hard mask layer 401 may be between about 100:1 and about 1.05:1, between about 100:1 and about 10:1, between about 50:1 and about 10:1, between about 30:1 and about 10:1, between about 20:1 and about 10:1, or between about 15:1 and about 10:1 during the second tilted etch process 503. In some embodiments, an etch rate ratio of the first insulating layer 107 to the conductive pillars 201-1, 201-3 may be between about 100:1 and about 1.05:1, between about 100:1 and about 10:1, between about 50:1 and about 10:1, between about 30:1 and about 10:1, between about 20:1 and about 10:1, or between about 15:1 and about 10:1 during the second tilted etch process 503.

The second set of tilted trenches 409 may be extended along a second direction E2 slanted with respect to the vertical axis Z. The second direction E2 and the first direction E1 may be crossed. In some embodiments, an acute angle δ' between the sidewalls 409SW of the second set of tilted trenches 409 and the bottom surfaces 409BS of the second set of tilted trenches 409 may be between about −10 degree and about −80 degree. In some embodiments, some portions of the first set of tilted trenches 407 and the second set of tilted trenches 409 may be overlapped. In other words, some of the first set of tilted trenches 407 and the second set of tilted trenches 409 may be crossed. The width W3 of the second set of tilted trenches 409 may be less than the width W1 of the first hard mask openings 405. In some embodiments, the width W3 of the second set of tilted trenches 409 may be the same as the width W2 of the first set of tilted trenches 407 but is not limited thereto.

Figure 17:
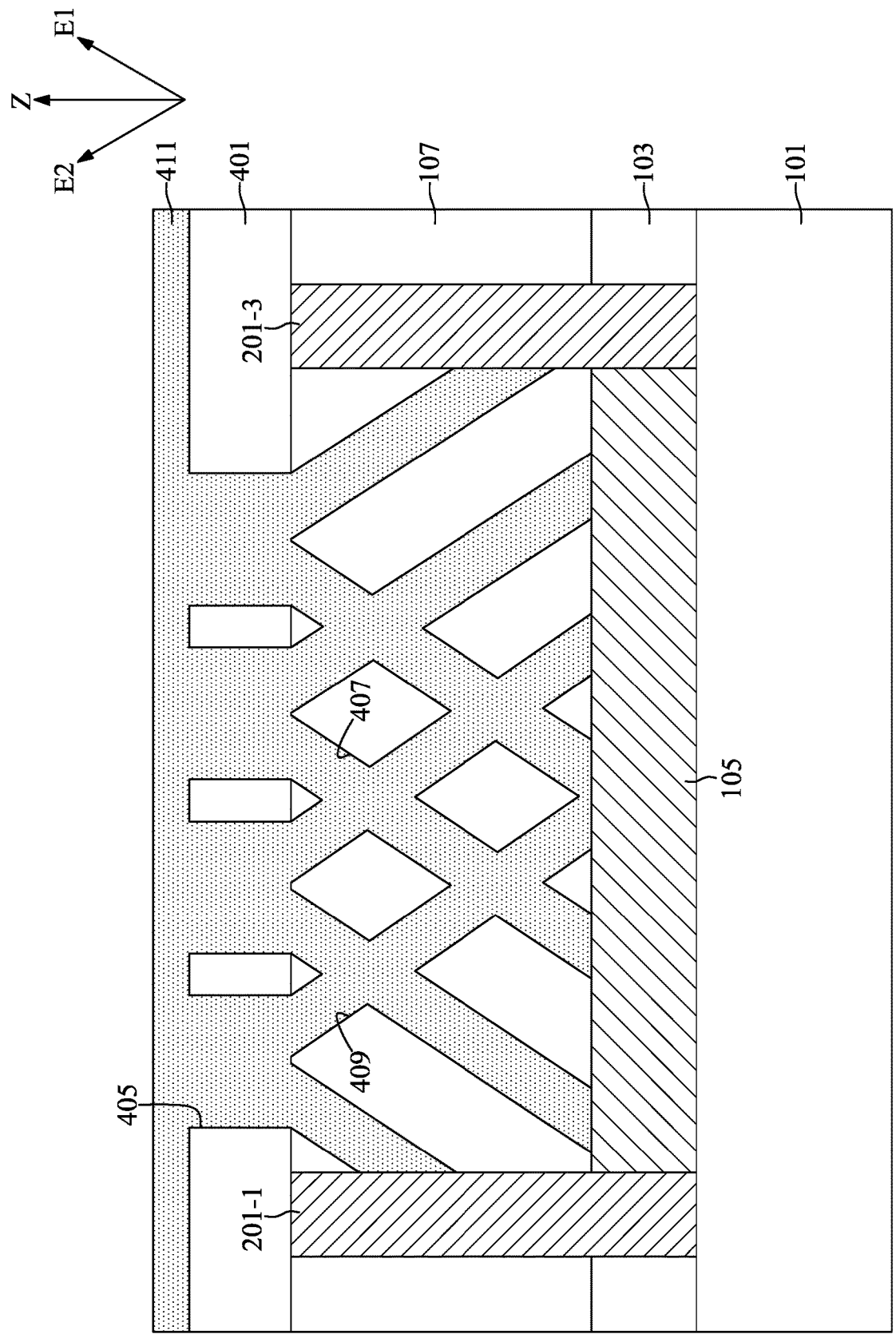
Figure 18:
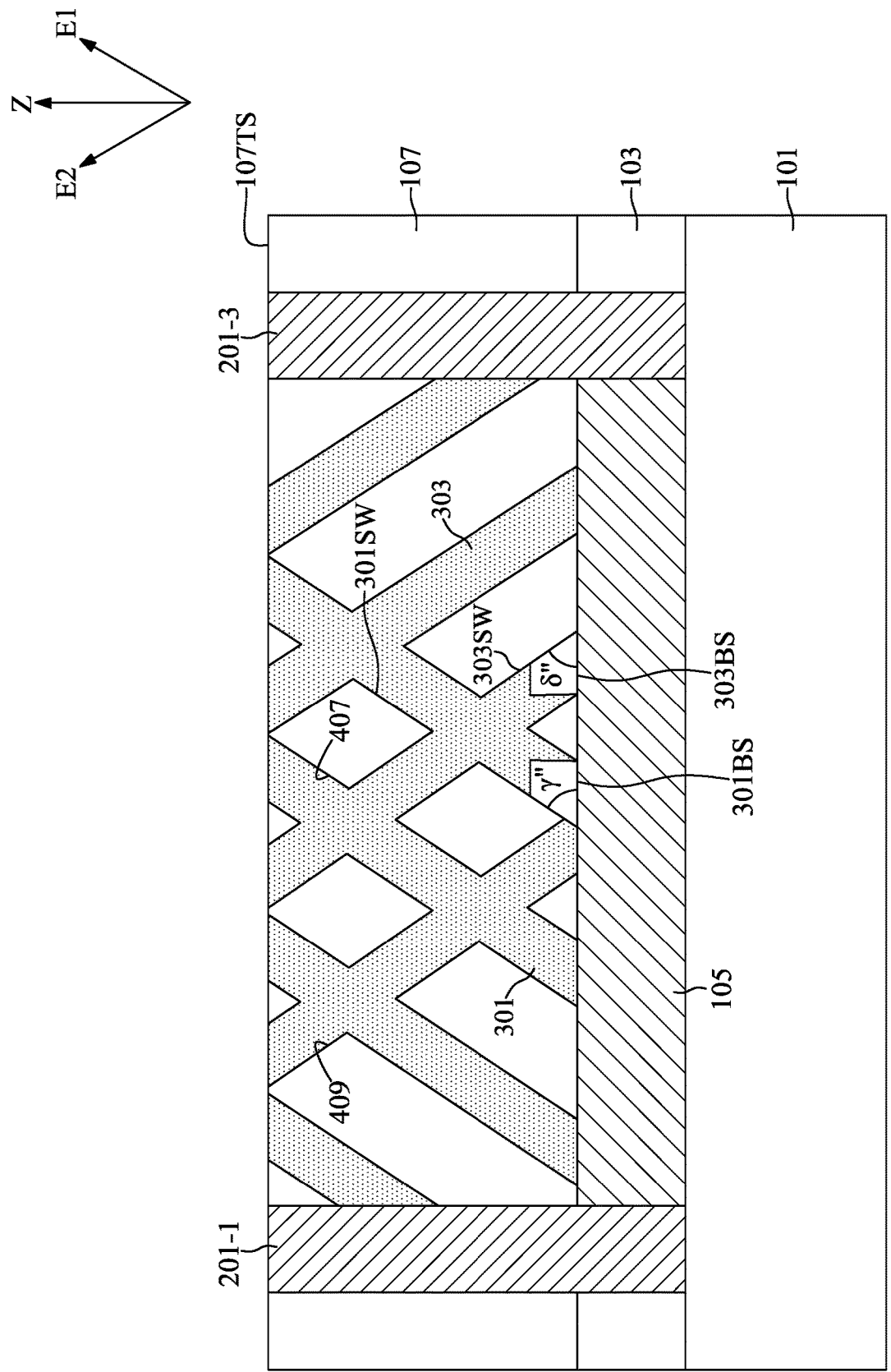

With reference to FIGS. 10, 17, and 18, at step S19, a first set of tilted insulating layers 301 may be formed in the first set of tilted trenches 407 and a second set of tilted insulating layers 303 may be formed in the second set of tilted trenches 409.

With reference to FIG. 17, a layer of first insulating materials 411 may be formed to completely fill the first set of tilted trenches 407, the second set of tilted trenches 409, and the first hard mask openings 405 and cover the first hard mask layer 401. In some embodiments, the first insulating materials 411 may be a different material from the material of the first insulating layer 107. In some embodiments, the first insulating materials 411 may be a material having a lower dielectric constant than the first insulating layer 107. In some embodiments, the first insulating materials 411 may be silicon nitride, silicon oxide, silicon oxynitride, silicon nitride oxide, flowable oxide, tonen silazen, undoped silica glass, borosilica glass, phosphosilica glass, borophosphosilica glass, plasma-enhanced tetra-ethyl orthosilicate, fluoride silicate glass, carbon-doped silicon oxide, organo silicate glass, or a combination thereof. In some embodiments, the first insulating materials 411 may be a material having a coefficient of thermal expansion less than about 20 ppm/° C. and a Young's Modulus less than about 15 GPa.

With reference to FIG. 18, a planarization process, such as chemical mechanical polishing, may be performed until the top surface 107TS of the first insulating layer 107 is exposed to remove excess material, provide a substantially flat surface for subsequent processing steps, and concurrently form the first set of tilted insulating layers 301 and the second set of tilted insulating layers 303.

The cross-sectional profile of the first set of tilted insulating layers 301 may be defined by the first set of tilted trenches 407. Specifically, the first set of tilted insulating layers 301 may be extended along the first direction E1. An acute angle γ" between the sidewalls 301SW of the first set of tilted insulating layers 301 and the bottom surfaces 301BS of the first set of tilted insulating layers 301 may be between about 10 degree and about 80 degree.

The cross-sectional profile of the second set of tilted insulating layers 303 may be defined by the second set of tilted trenches 409. Specifically, the second set of tilted insulating layers 303 may be extended along the second direction E2. An acute angle δ" between the sidewalls 303SW of the second set of tilted insulating layers 303 and the bottom surfaces 303BS of the second set of tilted insulating layers 303 may be between about −10 degree and about −80 degree. In some embodiments, some portions of the first set of tilted insulating layers 301 and the second set of tilted insulating layers 303 may be overlapped. In other words, some of the first set of tilted insulating layers 301 and the second set of tilted insulating layers 303 may be crossed.

Figure 19:
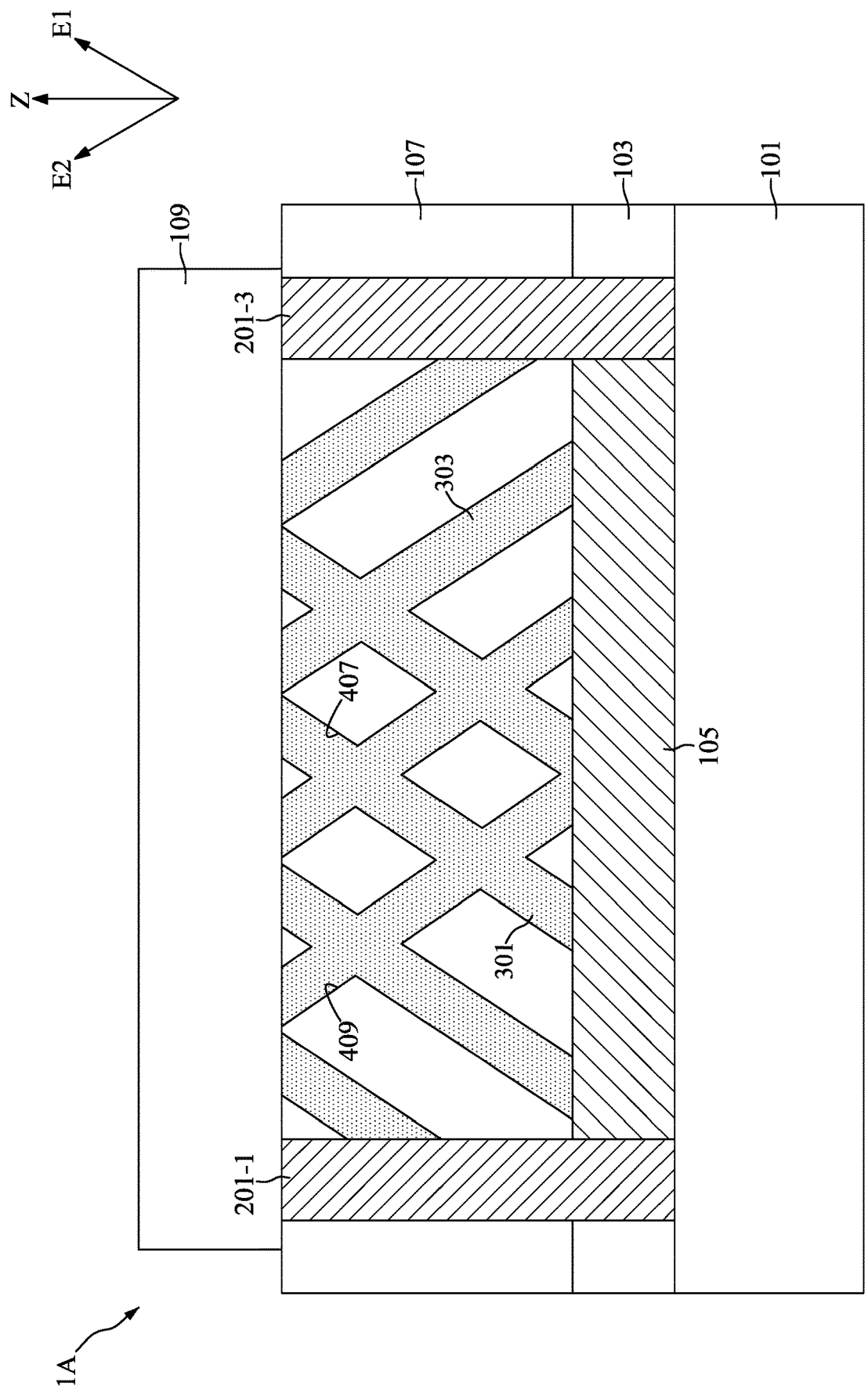

With reference to FIGS. 10 and 19, at step S21, a pad layer 109 may be formed on the conductive pillars 201-1, 201-3.

With reference to FIG. 19, the pad layer 109 may be formed covering the top surfaces of the conductive pillars 201-1, 201-3, the top surfaces of the first set of tilted insulating layers 301, and the top surfaces of the second set of tilted insulating layers 303. The pad layer 109 may be formed by a deposition process and a following photo-etch process. The deposition process may be physical vapor deposition, chemical vapor deposition, sputtering, or electroplating.

Figure 20:
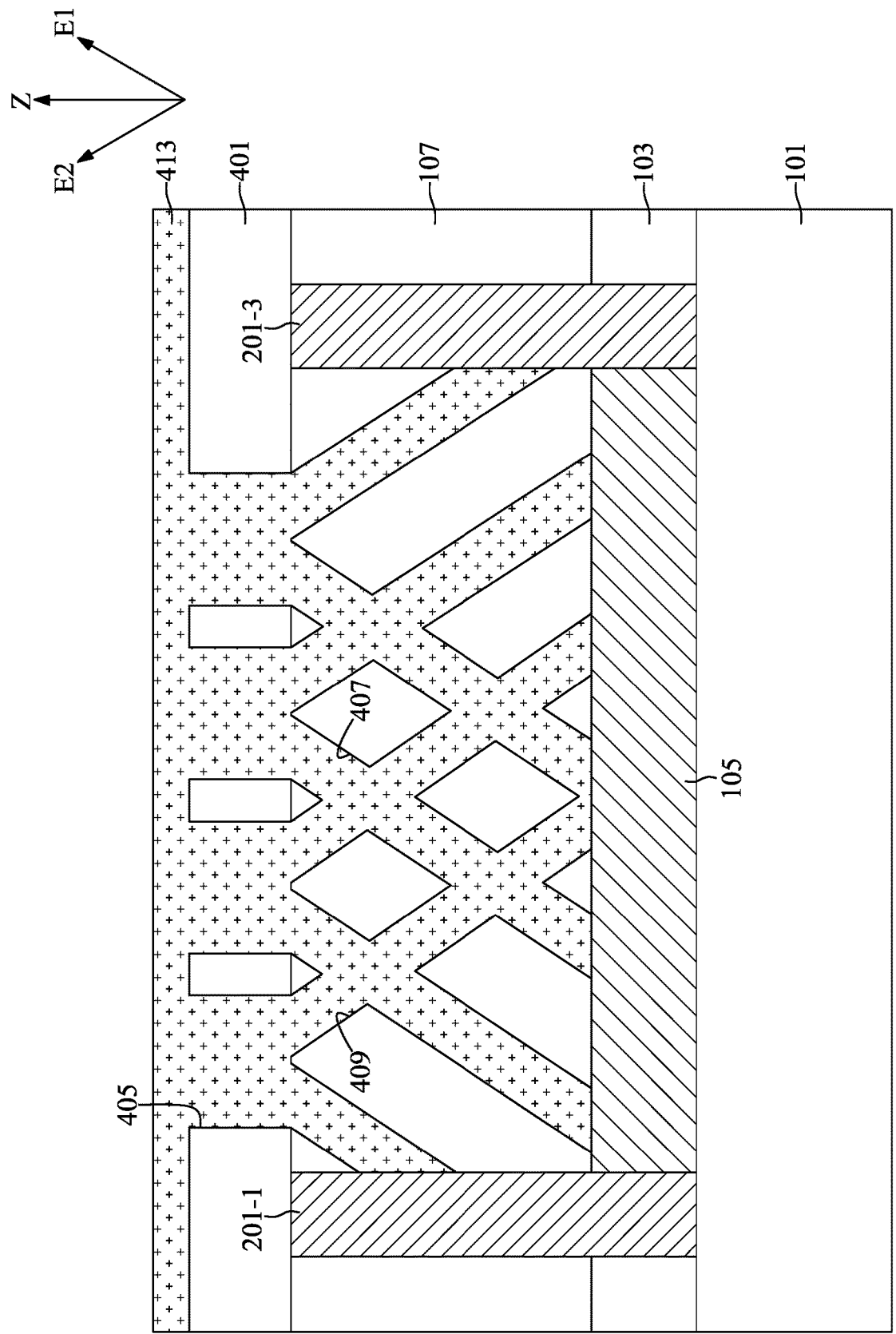
FIGS. 20 to 22 illustrate, in schematic cross-sectional view diagrams, a flow for fabricating the semiconductor device in accordance with another embodiment of the present disclosure.
Figure 21:
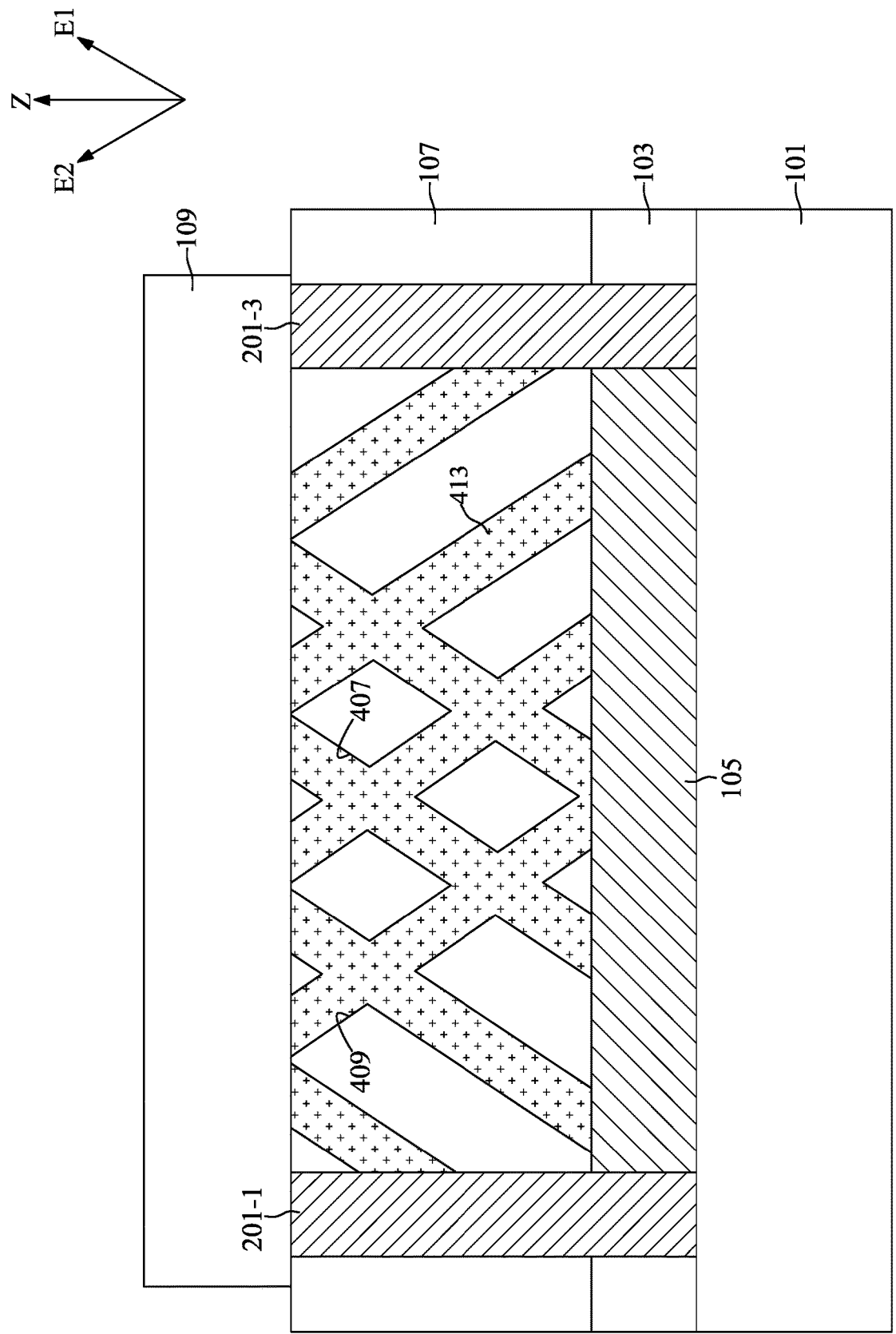
Figure 22:
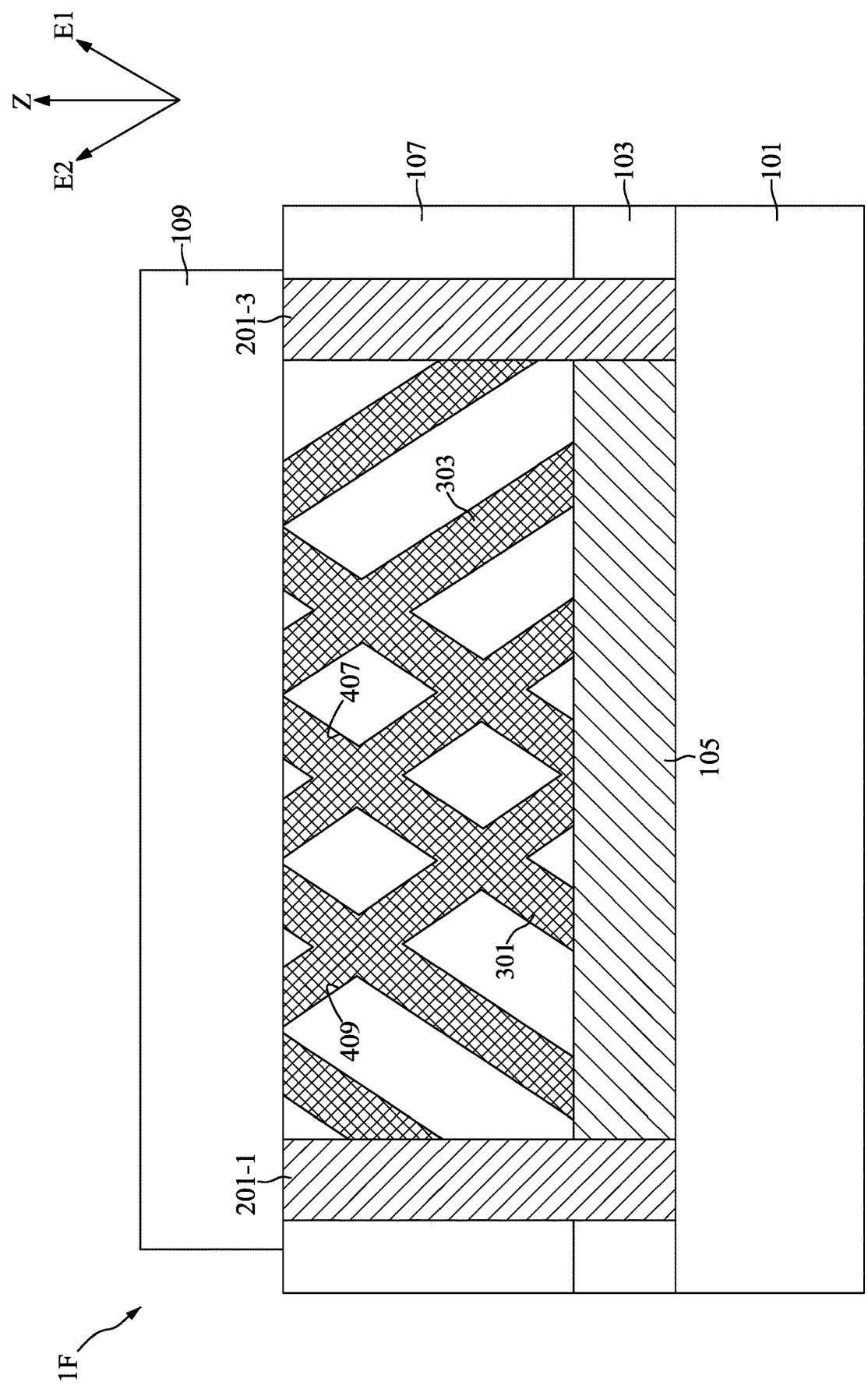

FIGS. 20 to 22 illustrate, in schematic cross-sectional view diagrams, a flow for fabricating the semiconductor device 1F in accordance with another embodiment of the present disclosure.

With reference to FIG. 20, an intermediate semiconductor device may be fabricating with a procedure similar to that illustrated in FIGS. 11 to 16. A layer of energy-removable composite 413 may completely fill the first set of tilted trenches 407, the second set of tilted trenches 409, and the first hard mask openings 405 and cover the first hard mask layer 401. The energy-removable composite 413 may include a material such as a thermal-decomposable material, a photonic-decomposable material, an e-beam decomposable material, or a combination thereof. For example, the energy-removable composite 413 may include a base material and a decomposable porogen material that is sacrificially removed upon exposure to an energy source. The base material may include a methylsilsesquioxane based material, low-dielectric material, or silicon oxide. The decomposable porogen material may include a porogen organic compound that provides porosity to the base material of the energy-removable composite 413. In some embodiments, the energy-removable composite 413 may include about 10% of the decomposable porogen material, and about 90% of the base material. In some embodiments, the energy-removable composite 413 may include about 80% of the decomposable porogen material, and about 20% of the base material.

With reference to FIG. 21, a planarization process similar to that illustrated in FIG. 18 may be performed. The pad layer 109 may be formed on the first insulating layer 107 by a procedure similar to that illustrated in FIG. 19.

With reference to FIG. 22, an energy treatment process may be performed on the intermediate semiconductor device in FIG. 21 by applying an energy source thereto. The energy source may include heat, light, or a combination thereof. When heat is used as the energy source, a temperature of the energy treatment may be between about 800° C. and about 900° C. When light is used as the energy source, an ultraviolet light may be applied. The energy treatment may remove the decomposable porogen material from the layer of energy-removable composite 413 to generate empty spaces (pores), with the base material remaining in place. After the energy treatment, the layer of energy-removable composite 413 may be turned into the first set of tilted insulating layers 301 and the second set of tilted insulating layers 303 which are porous.

One aspect of the present disclosure provides a semiconductor device including a substrate, two conductive pillars positioned above the substrate and extended along a vertical axis, a first set of tilted insulating layers parallel to each other and positioned between the two conductive pillars, and a second set of tilted insulating layers parallel to each other and positioned between the two conductive pillars. The first set of tilted insulating layers are extended along a first direction slanted with respect to the vertical axis, the second set of tilted insulating layers are extended along a second direction slanted with respect to the vertical axis, and the first direction and the second direction are crossed.

Another aspect of the present disclosure provides a method for fabricating a semiconductor device including providing a substrate, forming a first insulating layer above the substrate, forming two conductive pillars along the first insulating layer, forming a first set of tilted trenches along the first insulating layer and between the two conductive pillars, forming a second set of tilted trenches along the first insulating layer and between the two conductive pillars, forming a first set of tilted insulating layers in the first set of tilted trenches and along a first direction, forming a second set of tilted insulating layers in the second set of tilted trenches and along a second direction. The first set of tilted insulating layers and the second set of tilted insulating layers are concurrently formed, and the first direction and second direction are crossed.

Due to the design of the semiconductor device of the present disclosure, the first set of tilted insulating layers 301 and the second set of tilted insulating layers 303 may be used to adjust the dielectric constant between the conductive pillars 201-1, 201-3. Therefore, the parasitic capacitance between the conductive pillars 201-1, 201-3 may be reduced. As a result, the performance of the semiconductor device 1A may be improved. In addition, the first set of tilted insulating layers 301 and the second set of tilted insulating layers 303 may increase the elastic property of the first insulating layer 107 which may improve the resistance of the bonding strength of the semiconductor device 1A during a bonding process or a wiring process.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, and steps.

What is claimed is:

1. A semiconductor device, comprising:
   a substrate;
   two conductive pillars positioned above the substrate and extended along a vertical axis;
   a first set of tilted insulating layers parallel to each other and positioned between the two conductive pillars; and
   a second set of tilted insulating layers parallel to each other and positioned between the two conductive pillars;
   wherein the first set of tilted insulating layers are extended along a first direction slanted with respect to the vertical axis, the second set of tilted insulating layers are extended along a second direction slanted with respect to the vertical axis, and the first direction and the second direction are crossed.

2. The semiconductor device of claim 1, further comprising a first insulating layer positioned above the substrate, wherein the two conductive pillars are positioned along the first insulating layer, the first set of tilted insulating layers and the second set of tilted insulating layers are positioned in the first insulating layer, and the first set of tilted insulating layers and the second set of tilted insulating layers are formed of a different material from the first insulating layer.

3. The semiconductor device of claim 2, wherein the first set of tilted insulating layers and the second set of tilted insulating layers are formed of a material having a lower dielectric constant than that of the first insulating layer.

4. The semiconductor device of claim 3, further comprising a pad layer positioned on the two conductive pillars, the first set of tilted insulating layers, and the second set of tilted insulating layers.

5. The semiconductor device of claim 4, wherein an angle between the first direction and the vertical axis is between about 10 degree and about 80 degree.

6. The semiconductor device of claim 4, wherein an angle between the second direction and the vertical axis is between about −10 degree and about −80 degree.

7. The semiconductor device of claim 4, wherein an angle between the first direction and the vertical axis is different from an angle between the second direction and the vertical axis.

8. The semiconductor device of claim 4, wherein an angle between the first direction and the vertical axis is opposite to an angle between the second direction and the vertical axis.

9. The semiconductor device of claim 4, wherein bottom surfaces of the first set of tilted insulating layers and bottom surfaces of the second set of tilted insulating layers are substantially coplanar with a bottom surface of the first insulating layer.

10. The semiconductor device of claim 4, wherein bottommost points of the first set of tilted insulating layers and bottommost points of the second set of tilted insulating layers are at a vertical level above a bottom surface of the first insulating layer.

11. The semiconductor device of claim 2, wherein the first set of tilted insulating layers and the second set of tilted insulating layers are porous.

12. The semiconductor device of claim 11, wherein porosities of the first set of tilted insulating layers and the second set of tilted insulating layers are between about 10% and about 80%.

13. The semiconductor device of claim 2, wherein the first set of tilted insulating layers and the second set of tilted insulating layers are formed of a material having a coefficient of thermal expansion less than about 20 ppm/° C. and a Young's Modulus less than about 15 GPa.

14. A method for fabricating a semiconductor device, comprising:
   providing a substrate;
   forming a first insulating layer above the substrate;
   forming two conductive pillars along the first insulating layer;
   forming a first set of tilted trenches along the first insulating layer and between the two conductive pillars;
   forming a second set of tilted trenches along the first insulating layer and between the two conductive pillars;
   forming a first set of tilted insulating layers in the first set of tilted trenches and along a first direction;
   forming a second set of tilted insulating layers in the second set of tilted trenches and along a second direction;
   wherein the first set of tilted insulating layers and the second set of tilted insulating layers are concurrently formed, and the first direction and second direction are crossed.

15. The method for fabricating the semiconductor device of claim 14, wherein the first set of tilted insulating layers and the second set of tilted insulating layers are formed of a different material from the first insulating layer.

16. The method for fabricating the semiconductor device of claim 15, wherein the step of forming the first set of tilted trenches comprises:
   forming a first hard mask layer on the first insulating layer;

forming first hard mask openings along the first hard mask layer;

using the first hard mask layer and the first hard mask openings as pattern guides to perform a first tilted etch process on the first insulating layer to form the first set of tilted trenches.

17. The method for fabricating the semiconductor device of claim 16, wherein the first hard mask layer is formed of silicon oxide, silicon nitride, silicon oxynitride, silicon nitride oxide, boron nitride, silicon boron nitride, phosphorus boron nitride, boron carbon silicon nitride, or a carbon film.

18. The method for fabricating the semiconductor device of claim 17, wherein the step of forming a second set of tilted insulating layers comprises:

using the first hard mask layer and the first hard mask openings as pattern guides to perform a second tilted etch process on the first insulating layer to form the second set of tilted trenches and an angle of incidence of the first tilted etch process is opposite to the angle of incidence of the second tilted etch process.

19. The method for fabricating the semiconductor device of claim 18, wherein the step of forming the first set of tilted insulating layers and the step of forming the second set of tilted insulating layers comprises:

forming a layer of energy-removable composite in the first set of tilted trenches and the second set of tilted trenches and the layer of energy-removable composite comprises a base material and a decomposable porogen material;

performing an energy treatment to turn the layer of energy-removable composite into the first set of tilted insulating layers and the second set of tilted insulating layers.

20. The method for fabricating the semiconductor device of claim 14, wherein the first set of tilted insulating layers and the second set of tilted insulating layers are formed of a material having a lower dielectric constant than that of the first insulating layer.

* * * * *